(12) United States Patent
Xin et al.

(10) Patent No.: US 12,237,312 B2
(45) Date of Patent: Feb. 25, 2025

(54) LIGHT-EMITTING DIODE PACKAGING MODULE

(71) Applicant: QUANZHOU SANAN SEMICONDUCTOR TECHNOLOGY CO., LTD., Nanan (CN)

(72) Inventors: Shuning Xin, Xiamen (CN); Chen-Ke Hsu, Xiamen (CN); Aihua Cao, Xiamen (CN); Junpeng Shi, Xiamen (FJ); Weng-Tack Wong, Xiamen (CN); Yanqiu Liao, Xiamen (CN); Zhen-Duan Lin, Xiamen (CN); Changchin Yu, Xiamen (CN); Chi-Wei Liao, Xiamen (CN); Zheng Wu, Xiamen (CN); Chia-En Lee, Xiamen (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 412 days.

(21) Appl. No.: 17/654,317

(22) Filed: Mar. 10, 2022

(65) Prior Publication Data
US 2022/0199590 A1    Jun. 23, 2022

Related U.S. Application Data

(63) Continuation-in-part of application No. PCT/CN2020/098503, filed on Jun. 28, 2020.

(30) Foreign Application Priority Data

Sep. 18, 2019   (CN) .......................... 201921553483.2
Sep. 18, 2019   (CN) .......................... 201921553484.7

(51) Int. Cl.
*H01L 25/075*    (2006.01)
*H01L 33/38*    (2010.01)
(Continued)

(52) U.S. Cl.
CPC ........ *H01L 25/0753* (2013.01); *H01L 33/382* (2013.01); *H01L 33/56* (2013.01); *H01L 33/62* (2013.01)

(58) Field of Classification Search
CPC ... H01L 33/483–486; H01L 2933/0033; H01L 33/52–56; H01L 2933/005
See application file for complete search history.

(56) References Cited

U.S. PATENT DOCUMENTS

2016/0276546 A1*   9/2016   Lee ........................ H01L 33/62
2017/0200868 A1*   7/2017   Nakabayashi .......... H01L 33/62
(Continued)

FOREIGN PATENT DOCUMENTS

CN     109952641 A    6/2019

OTHER PUBLICATIONS

Search Report issued to PCT application No. PCT/CN2020/098503 on Sep. 30, 2020.

*Primary Examiner* — Evren Seven
*Assistant Examiner* — Cole Leon Lindsey
(74) *Attorney, Agent, or Firm* — MUNCY, GEISSLER, OLDS & LOWE, P.C.

(57) ABSTRACT

A light-emitting diode (LED) packaging module includes a plurality of LED chips spaced apart from one another, an encapsulating layer that fills in a space among the LED chips, a light-transmitting layer disposed on the encapsulating layer, a wiring assembly disposed on and electrically connected to the LED chips, and an insulation component that covers the encapsulating layer and the wiring assembly. Each of the LED chips includes an electrode assembly
(Continued)

including first and second electrodes. The light-transmitting layer includes a light-transmitting layer that has a light transmittance greater than that of the encapsulating layer.

19 Claims, 14 Drawing Sheets

(51) Int. Cl.
*H01L 33/56* (2010.01)
*H01L 33/62* (2010.01)

(56) References Cited

U.S. PATENT DOCUMENTS

2019/0019780 A1* 1/2019 Kim ........................ H01L 33/62
2019/0067256 A1* 2/2019 Kurimoto ............... H01L 33/44

* cited by examiner

LIGHT-EMITTING DIODE PACKAGING MODULE

CROSS-REFERENCE TO RELATED APPLICATION

This application is a bypass continuation-in-part (CIP) application of PCT International Application No. PCT/CN2020/098503, filed on Jun. 28, 2020, which claims priorities of Chinese Utility Model Patent Application No. 201921553483.2, filed on Sep. 18, 2019, and Chinese Utility Model Patent Application No. 201921553484.7, filed on Sep. 18, 2019. The entire content of the Chinese patent applications is incorporated herein by reference.

FIELD

The disclosure relates to a packaging module, and more particularly to a light-emitting diode (LED) packaging module.

BACKGROUND

At present, light-emitting diodes (LEDs) are one of the most popular lighting technology. LEDs can be used as a light source for lighting devices as well as for various other electronic devices. For example, LEDs are widely employed in televisions, cellular phones, personal computers (PCs), personal digital assistants (PDAs), and numerous display devices. As LED technology advances, display resolution increases as the size of LED devices reduces, thereby expanding the applicability of LED devices, such as in smartphones, car panels, and equipment used in video conferences, etc. Currently, sizes of LED packages for mainstream display screens are 2.1 mm×2.1 mm (i.e., 2121) and 1.0 mm×1.0 mm (i.e., 1010). With further development of LED technology, LED packages with a size of 0.8 mm×0.8 mm (i.e., 0808) or even smaller have appeared on the market.

SUMMARY

Therefore, an object of the disclosure is to provide a light-emitting diode (LED) packaging module that can achieve a smaller LED package size. According to the disclosure, the LED packaging module includes a plurality of LED chips that are spaced apart from one another, an encapsulating layer, a light-transmitting layer, a wiring assembly, and an insulation component. Each of the LED chips includes a chip first surface as a light-exiting surface, a chip second surface opposite to the first surface, a chip side surface that connects the chip first surface and the chip second surface, and an electrode assembly disposed on the chip second surface, the electrode assembly including a first electrode and a second electrode. The encapsulating layer covers the chip side surface of each of the LED chips, fills in a space among the LED chips, and exposes the first electrode, the second electrode, and at least a portion of the chip first surface of the LED chips. The encapsulating layer is a colored layer. The light-transmitting layer is disposed on the encapsulating layer, covers the chip first surfaces of the LED chips exposed from the encapsulating layer, and has a light transmittance greater than that of the encapsulating layer. The wiring assembly is disposed on the chip second surface of each of the LED chips, and has a first wiring assembly surface connected to the electrode assembly of the LED chips, a second wiring assembly surface opposite to the first wiring assembly surface, and a side wiring assembly surface connected to the first wiring assembly surface and the second wiring assembly surface. The insulation component covers the encapsulating layer and the wiring assembly.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
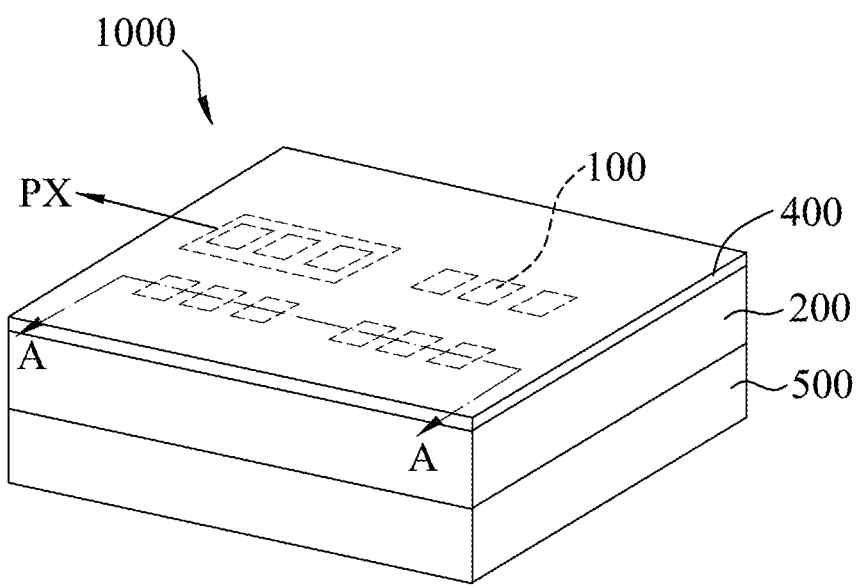
FIG. 1 is a perspective view illustrating a first embodiment of a light-emitting diode (LED) packaging module according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
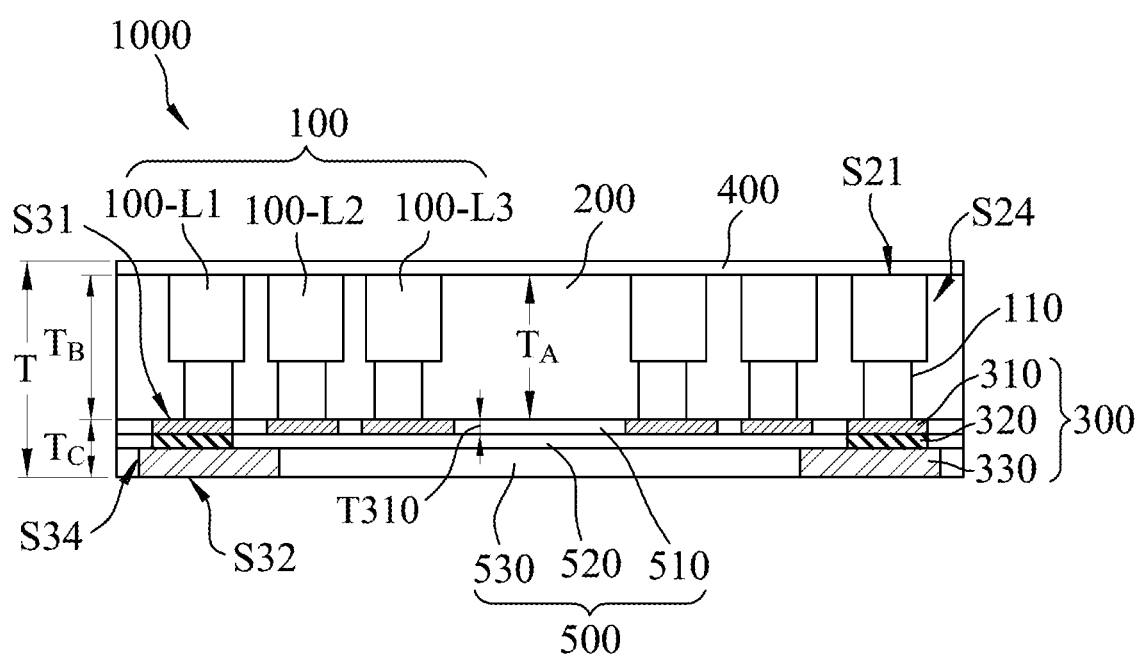
FIG. 2 is a cross-sectional view taken along line A-A of FIG. 1.
Figure 3:
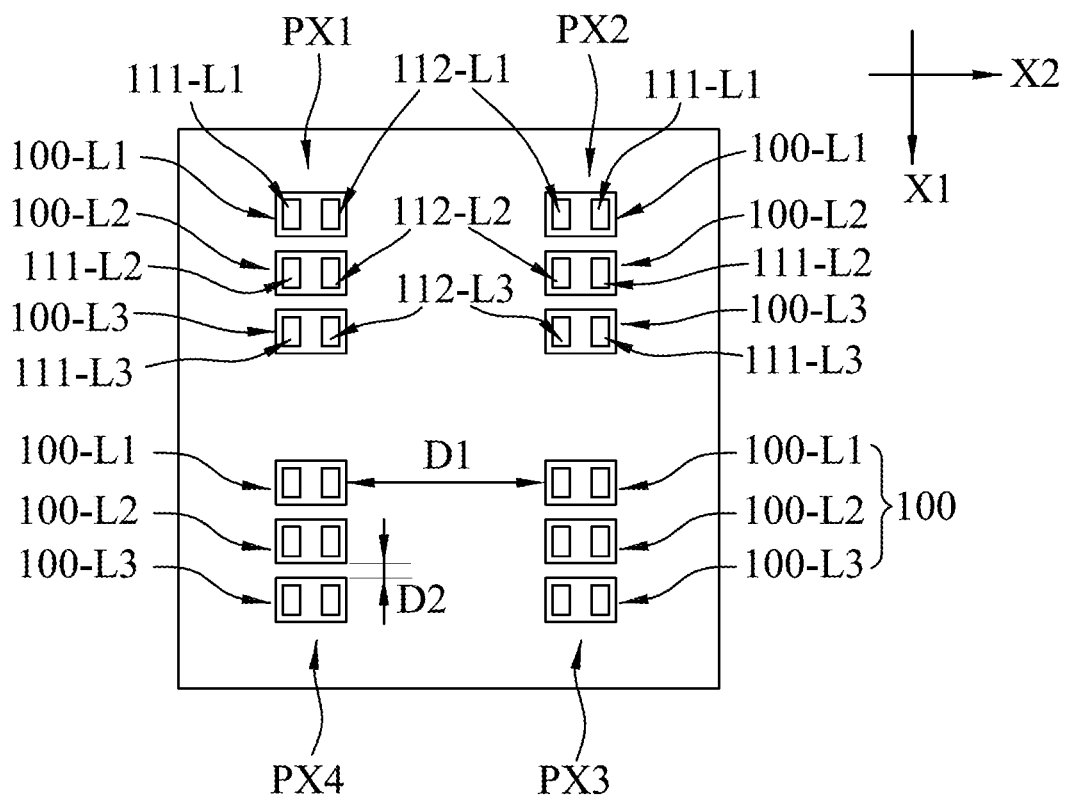
FIG. 3 is a top view illustrating an arrangement of LED chips in the LED packaging module in accordance with some embodiments of the present disclosure.
Figure 4:
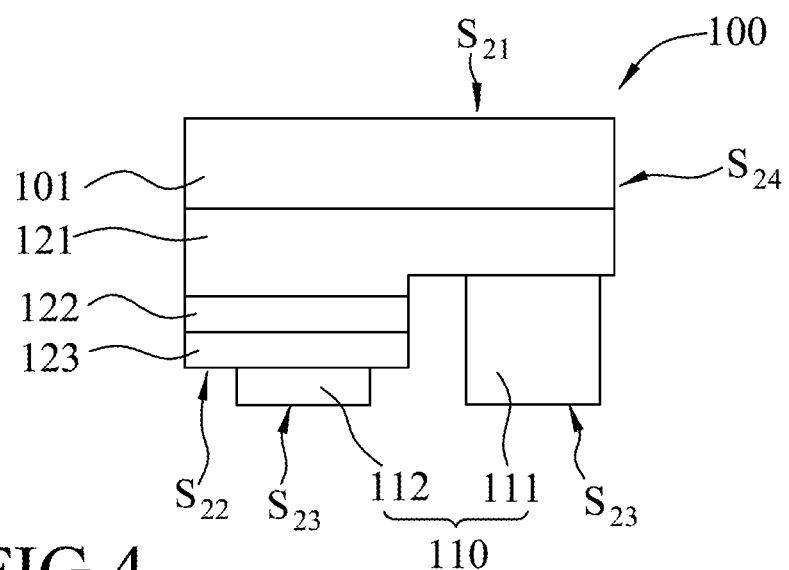
FIG. 4 is a schematic view illustrating one of the LED chips in accordance with some embodiments of the present disclosure.

As shown in FIGS. 1 to 3, a first embodiment of a light-emitting diode (LED) packaging module 1000 according to the disclosure includes a plurality of light-emitting units (PX), an encapsulating layer 200, and a wiring assembly 300. The light-emitting units (PX) are arranged in an array having m row(s) and n column(s), where m and n each independently represents a positive integer and m×n is not less than 4. Each of the light-emitting units (PX) includes a plurality of LED chips 100 which are spaced apart from each other. The LED chips 100 of each of the light-emitting units (PX) are arranged in a first direction (X1). Each of the light-emitting units (PX) includes at least three of the LED chips 100. In certain embodiments, each of the light-emitting units (PX) includes three LED chips 100, i.e., a first LED chip 100-L1, a second LED chip 100-L2, and a third LED chip 100-L3 (see FIGS. 2 and 3). As shown in FIGS. 2 and 4, each of the first, second, and third LED chips 100-L1, 100-L2, 100-L3 includes a chip first surface S21 serving as a light-exiting surface, a chip second surface S22 opposite to the chip first surface S21, a chip side surface S24 that connects the chip first surface S21 and the chip second surface S22, and an electrode assembly 110 disposed on the chip second surface S22. The electrode assembly 110 includes a first electrode 111 and a second electrode 112. The first electrode 111 and the second electrode 112 of each of the LED chips 100 are aligned in a second direction (X2) different from the first direction (X1). The encapsulating layer 200 covers the chip side surface S24 of each of the LED chips 100, fills in a space among the LED chips 100, and exposes the first electrode 111, the second electrode 112, and at least a portion of the chip first surface S21 of the LED chips 100. The encapsulating layer 200 may be a colored layer. The wiring assembly 300 is disposed on the encapsulating layer 200 and the chip second surface S22 of each of the LED chips 100, and is electrically connected to the first and second electrodes 111, 112 of the electrode assembly 110. The wiring assembly 300 has a first wiring assembly surface S31 connected to the electrode assembly 110 of each of the LED chips 100, a second wiring assembly surface S32 opposite to the first wiring assembly surface S31, and a side wiring assembly surface S34 connected to the first wiring assembly surface S31 and the second wiring assembly surface S32. The wiring assembly 300 electrically connects the first electrodes 111 of the first, second, and third LED chips 100-L1, 100-L2, 100-L3 of at least two adjacent ones of the light-emitting units (PX) in parallel in a third direction, the third direction being the same as the first direction (X1) or the second direction (X2). The wiring assembly 300 electrically connects the second electrodes 112 of the first, second, and third LED chips 100-L1, 100-L2, 100-L3 of at least two adjacent ones of the light-emitting units (PX) in parallel in a fourth direction. The fourth direction is the same as the first direction (X1) or the second direction (X2), and is different from the third direction.

The LED chips 100 of each of the light-emitting units (PX) may have different wavelengths. In certain embodiments, the first LED chip 100-L1 is a red LED chip (R), the second LED chip 100-L2 is a green LED chip (G), and third LED chip 100-L3 is a blue LED chip (B). In some embodiments, the LED chips 100 may further include a white LED chip (W, not shown) that has a wavelength conversion layer so as to form an RGBW combination, which can improve the brightness of a display device and is beneficial for outdoor display. In some embodiments, two adjacent ones of the LED chips 100 are spaced apart from each other by a distance not greater than about 0.8 mm. Each of the light-emitting units (PX) is substantially the same as a pixel. In some embodiments, the light-emitting units (PX) are arranged in an array including at least two rows and at least two columns. In the first embodiment, the light-emitting units (PX) in the LED packaging module 1000 are arranged in a 2×2 array (i.e., the array includes two rows and two columns).

The wiring assembly 300 may include a plurality of interconnecting layers. In certain embodiments, the wiring assembly 300 includes a first wiring layer 310, a via layer 320, and a second wiring layer 330. In each of the first wiring layer 310, the via layer 320, and the second wiring layer 330, wires/vias are insulated from one another by an insulation component 500 (see FIG. 2). The insulation component 500 is disposed on the encapsulating layer 200, and the wiring assembly 300 is formed in and extends through the insulation component 500. The insulation component 500 may have a plurality of insulation layers. In certain embodiments, at least one of the insulation layers has a hardness greater than that of the wiring assembly 300. In certain embodiments, the hardness of at least one of the insulation layers is not less than D60 (shore D hardness). In some embodiments, at least one of the insulation layers is made of a material that is the same as that of the encapsulating layer 200. The first wiring layer 310 is disposed on the chip second surfaces S22 of the LED chips 100 and is electrically connected to at least one of the first electrode 111 and the second electrode 112 of each of the LED chips 100. The via layer 320 is disposed on and is electrically connected to the first wiring layer 310. The second wiring layer 330 is disposed on and is electrically connected to the via layer 320.

In FIG. 3, a top view of an arrangement of the LED chips 100 in the first embodiment of the LED packaging module 1000 is provided. Referring to FIG. 3, the LED packaging module 1000 has four of the light-emitting units (i.e., PX1, PX2, PX3, PX4).

Each of the light-emitting units PX1, PX2, PX3, PX4 includes a plurality of the LED chips 100. In this embodiment, each of the PX1, PX2, PX3, PX4 includes the first LED chip 100-L1, the second LED chip 100-L2, and the third LED chip 100-L3. In some other embodiments, each of the PX1, PX2, PX3, PX4 includes two of the LED chips 100 or more than three of the LED chips 100 (e.g., four of the LED chips 100). As mentioned above, the first, second, and third LED chips 100-L1, 100-L2, 100-L3 may emit light with different wavelengths, e.g., red light, green light, and blue light.

Referring further to FIG. 4, each of the LED chips 100-L1, 100-L2, 100-L3 may have a flip-chip structure.

Each of the first electrode 111 and the second electrode 112 of the electrode assembly 110 has an electrode surface S23 distal from the chip second surface S22.

In some embodiments, each of the LED chips 100 further includes a substrate 101 that has one surface serving as the chip first surface S21 (i.e., the light-exiting surface). In certain embodiments, the substrate 101 may be a transparent substrate. In some embodiments, each of the LED chips 100 further includes a semiconductor stack that is formed on another surface of the substrate 101 opposite to the one surface serving as the chip first surface S21, and that includes a first semiconductor layer 121, an active layer 122, and a second semiconductor layer 123. The first semiconductor layer 121 has a conductivity type different from that of the second semiconductor layer 123. In some embodiments, the first semiconductor layer 121 may be a p-type semiconductor layer, and the second semiconductor layer 123 may be an n-type semiconductor layer. In some other embodiments, the first semiconductor layer 121 may be an n-type semiconductor layer, and the second semiconductor layer 123 may be a p-type semiconductor layer. The first electrode 111 is electrically connected to the first semiconductor layer 121, and the second electrode 112 is electrically connected to the second semiconductor layer 123. In certain embodiments, the electrode assembly 110 may further include a thickened electrode (not shown) made of a conductive material. The thickened electrode may be disposed between the first electrode 111 and the first wiring layer 310 and/or between the second electrode 112 and the first wiring layer 310. The thickened electrode may be formed by, e.g., electroplating, electroless plating, or printing. The thickened electrode may include, but not limited to, Cu, $Cu_xW$, or other conductive metals. By having the thickened electrode, an area of each of the chip side surfaces S24 may be enlarged, and a contact area between the chip side surfaces S24 of the LED chips 100 and the encapsulating layer 200 can be increased, thereby increasing adhesion between the LED chips 100 and the encapsulating layer 200. In some embodiments, the electrode assembly 110 of each of the LED chips 100 has a thickness ranging from about 5 µm to about 200 µm. In certain embodiments, according to actual requirements, the thickness of the electrode assembly 110 may range from, for example, but not limited to, 5 µm to 30 µm, 30 µm to 50 µm, or 80 µm to 120 µm. Each of the LED chips 100 may be one of a regular-sized LED chip (generally refers to a chip having a side length of more than about 200 µm), a mini LED chip (generally refers to a chip having a size that ranges from 100 µm to 200 µm), and a micro LED chip (generally refers to a chip having a size not greater than about 100 µm). In this embodiment, the LED chips 100 are mini LED chips or micro LED chips.

Referring back to FIG. 3, the first, second, and third LED chips 100-L1, 100-L2, 100-L3 of each of the PX1, PX2, PX3, PX4 of the LED packaging module 1000 are aligned such that the first electrodes 111-L1, 111-L2, 111-L2 of the first, second, and third LED chips 100-L1, 100-L2, 100-L3 are aligned in the first direction (X1), and the second electrodes 112-L1, 112-L2, 112-L3 of the first, second, and third LED chips 100-L1, 100-L2, 100-L3 are aligned in the first direction (X1). To be specific, the LED chips 100-L1, 100-L2, 100-L3 of each of the PX1, PX2, PX3, PX4 are arranged in a column (i.e., aligned in the first direction (X1)). The first electrode 111 and the second electrode 112 of each of the LED chips 100-L1, 100-L2, 100-L3 are aligned in the second direction (X2). In some embodiments, the first and second electrodes 111-L1, 111-L2, 111-L2, 112-L1, 112-L2, 112-L3 of the LED chips 100-L1, 100-L2, 100-L3 of the LED packaging module 1000 in one column are aligned mirror-symmetrically to the first and second electrodes 111-L1, 111-L2, 111-L2, 112-L1, 112-L2, 112-L3 of the LED chips 100-L1, 100-L2, 100-L3 in an adjacent column. The mirror-symmetrically arrangement is convenient for wiring, and can reduce a space among the LED chips 100. For example, as shown in FIG. 3, the first and second electrodes 111-L1, 111-L2, 111-L2, 112-L1, 112-L2, 112-L3 of the LED chips 100-L1, 100-L2, 100-L3 of the PX1 are aligned mirror-symmetrical to the first and second electrodes 111-L1, 111-L2, 111-L2, 112-L1, 112-L2, 112-L3 of the LED chips 100-L1, 100-L2, 100-L3 of the PX2. As mentioned above, each of the PX1, PX2, PX3, PX4 is seen as a pixel, and a pitch (D1) between two adjacent ones of the pixels may be not greater than about 1 mm. In some embodiments, the pitch (D1) may be, for example, but not limited to, not greater than about 0.8 mm. The pitch (D1) may be in a range of, for example, but limited to, about 0.1 mm to about 0.3 mm, about 0.3 mm to about 0.5 mm, or about 0.5 mm to about 0.8 mm. In some embodiments, adjacent two of the LED chips 100-L1, 100-L2, 100-L3 in each of the PX1, PX2, PX3, PX4 are spaced apart by a distance (D2) that is not greater than about 100 µm. In some other embodiments, the distance (D2) ranges from about 50 µm to about 100 µm. In yet some other embodiments, the distance (D2) is not greater than about 50 µm. In certain embodiments, the distance (D2) may be within a range of, for example, but not limited to, 40 µm to 50 µm, 30 µm to 40 µm, 20 µm to 30 µm, or 10 µm to 20 µm. The smaller the distance (D2), the smaller the size of the LED packaging module 1000, thereby improving the resolution of a display panel using the LED packaging module 1000.

Referring back to FIG. 2, the encapsulating layer 200 has a light transmittance not greater than about 50%. In some embodiments, the light transmittance of the encapsulating layer 200 is not greater than about 30%. In certain embodiments, the light transmittance of the encapsulating layer 200 ranges from about 5% to about 20%. In certain embodiments, the encapsulating layer 200 is opaque and non-transparent. The encapsulating layer 200 may include a light-absorbing material (not shown) that at least surrounds the chip side surface S24 of each of the LED chips 100, or that is disposed between the adjacent LED chips 100. In some embodiments, the light-absorbing material at least surrounds the semiconductor stack or is disposed between adjacent semiconductor stacks. In some embodiments, the light-absorbing material may be light-absorbing particles dispersed in the encapsulating layer 200. The light-absorbing material may be, for example, but not limited to, black particles (e.g., carbon powder) or black resin. The position of the light-absorbing material of the encapsulating layer 200 (i.e., at least surrounds the chip side surface S24 of each of the LED chips 100) may at least prevent light from emitting outwardly from the chip side surface S24 of each of the LED chips 100, thereby ensuring that light mainly or wholly concentrates on the light-exiting surfaces (i.e., the chip first surfaces S21) of the LED chips 100. Therefore, optical crosstalk or light mixing among the LED chips 100 may be reduced. In some embodiments, the encapsulating layer 200 may be made of epoxy resin or silica gel mixed with a black colorant so that, except for the chip first surfaces S21 (i.e., the light-exiting surfaces), a side portion of each of the LED chips 100 is covered by the encapsulating layer 200, which increases contrast of a display panel including the LED packaging module 1000. Meanwhile, by isolating each of the LED chips 100 through the black material, optical interference among the LED chips 100 can be reduced. In certain embodiments, the encapsulating layer 200 has a hardness that is not less than D60. In alternative embodiments, the hardness of the encapsulating layer 200 is not less than D85.

In some embodiments, the LED packaging module 100 further includes a light-transmitting layer 400 (see FIGS. 1 and 2) that is disposed on the encapsulating layer 200 opposite to the wiring assembly 300, and that covers the chip first surfaces S21 of the LED chips 100 so as to prevent the LED chips 100 from being exposed. In some embodiments, each of the light-emitting units (PX) has a first light-emitting unit surface having the chip first surface S21 of each of the first, second, and third LED chips 100-L1, 100-L2, 100-L3. When the encapsulating layer 200 is a colored layer, the light-transmitting layer 400 is disposed on the first light-emitting unit surface of each of the light-emitting units (PX), and the light-transmitting layer 400 has a light transmittance that is greater than that of the encapsulating layer 200. The light-transmitting layer 400 may serve as a light-scattering lens to produce a light-scattering effect. Thus, when the LED packaging module 1000 is used for display, a vertigo feeling can be effectively reduced. The light-transmitting layer 400 may include a light-scattering material, such as scattering particles. In some embodiments, the light-transmitting layer 400 has a thickness not greater than 20 μm, such as ranging from about 5 μm to about 20 μm (e.g., about 10 μm) so that, in addition to protect the light-exiting surfaces of the LED chips 100, optical interference among the LED chips 100 can be reduced. The light-transmitting layer 400 has a light transmittance not less than about 40%. In some embodiments, when the LED packaging module 1000 is applied in indoor display, the light-transmitting layer 400 has a light transmittance that ranges from about 40% to about 80% or from about 70% to about 80%, which can reduce the brightness of the LED chips 100, thereby reducing glare. In some other embodiments, when the LED packaging module 1000 is applied in outdoor display, the light-transmitting layer 400 is a transparent layer and has a light transmittance of not less than about 80%. In certain embodiments, the light transmittance of the light-transmitting layer 400 is about 80%.

Figure 5:
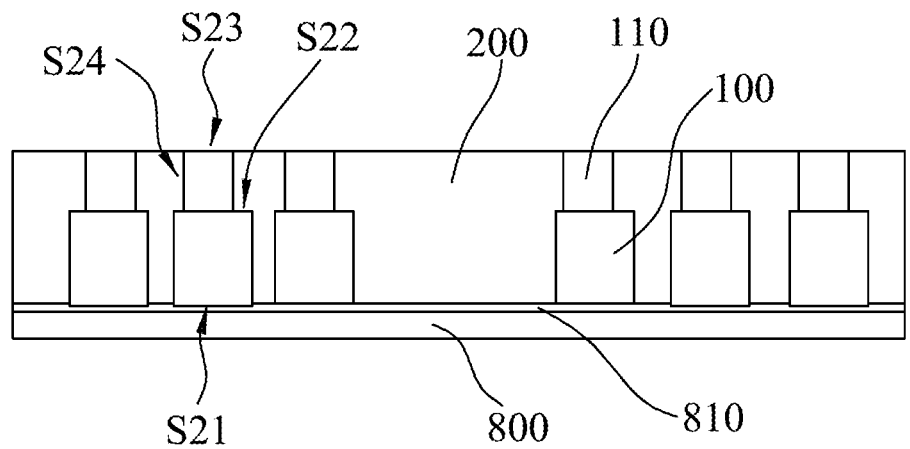
FIG. 5 is a schematic view illustrating die-bonding of the LED chips in accordance with some embodiments of the present disclosure.

In some embodiments, as shown in FIG. 5, the first, second, and third LED chips 100-L1, 100-L2, 100-L3 can be temporarily adhered to a support 800 with the light-emitting surfaces S21 of the LED chips 100 facing the support 800 and the electrode surface S23 facing upwardly (i.e., away from the support 800). The support 800 may be an adhesive tape, but not limited thereto. A fluid of an insulating material fills in a space among the LED chips 100, and is then cured to form the encapsulating layer 200. The electrode surfaces S23 are exposed from the encapsulating layer 200. In certain embodiments, the support 800 includes an adhesive layer 810 that has a thickness ranging from about 5 μm to about 20 μm so as to ensure that the LED chips 100 is not displaced when forming the encapsulating layer 200 and that the chip first surfaces S21 of the LED chips 100-L1, 100-L2, 100-L3 are at substantially the same height. In certain embodiments, a maximum height difference among the chip first surfaces S21 of the LED chips 100 is basically not greater than about 10 μm. Such design is beneficial for unifying light-exiting surfaces (i.e., the chip first surfaces S21 of the LED chips 100 are at substantially the same height) and reducing optical crosstalk among the side surfaces S24 of the LED chips 100 when the number of the light-emitting units (PX) in the LED packaging module 1000 is increased.

The wiring assembly 300 may include a metallic material having a melting point higher than about 400° C., such as Ag, Cu, Ni, Al, etc. The interconnecting layers of the wiring assembly 300 may be made of the same or different materials. The interconnecting layers may be formed using electroplating, electroless plating, and/or printing. Each of the interconnecting layers of the wiring assembly 300 may have a thickness $T_W$ that is not greater than about 100 μm.

Figure 6:
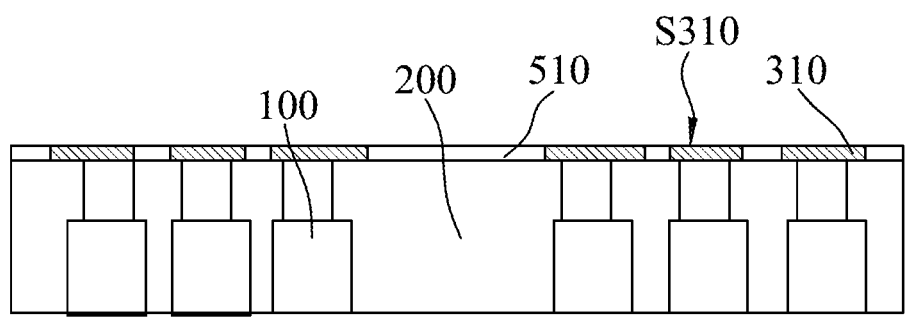
FIG. 6 is a schematic view illustrating a first wiring layer of the first embodiment of the LED packaging module according to the present disclosure.

Referring to FIG. 6, the first wiring layer 310 is disposed on the encapsulating layer 200, and is electrically connected to at least one of the first electrode 111 and the second electrode 112 of each of the LED chips 100. The LED packaging module 1000 further includes a first insulation layer 510 that is disposed on the encapsulating layer 200. The first wiring layer 310 is formed in and extending through the first insulation layer 510 to expose a surface S310 of the first wiring layer 310 distal from the LED chip 100. The first insulation layer 510 may be made of a material the same as or different from that of the encapsulating layer 200. When the first insulation layer 510 is made of the same material as that of the encapsulating layer 200, the first insulation layer 510 and the encapsulating layer 200 may be integrally connected, and it would be hard to distinguish the first insulation layer 510 from the encapsulating layer 200. In some embodiments, when the LED packaging module 1000 is applied in a display device, the first insulation layer 510 and the encapsulating layer 200 are made of epoxy resin or silica gel mixed with a colorant. In certain embodiments, the first insulation layer 510 has a hardness that is not less than a hardness of the first wiring layer 310. In some embodiments, the first insulation layer 510 has a hardness that is not less than D60. In some other embodiments, the first insulation layer 510 has a hardness that is not less than D85, which is beneficial for removing an excess of the first insulation layer 510 (e.g., by grinding) in order to expose the surface S310 of the first wiring layer 310.

Figure 7:
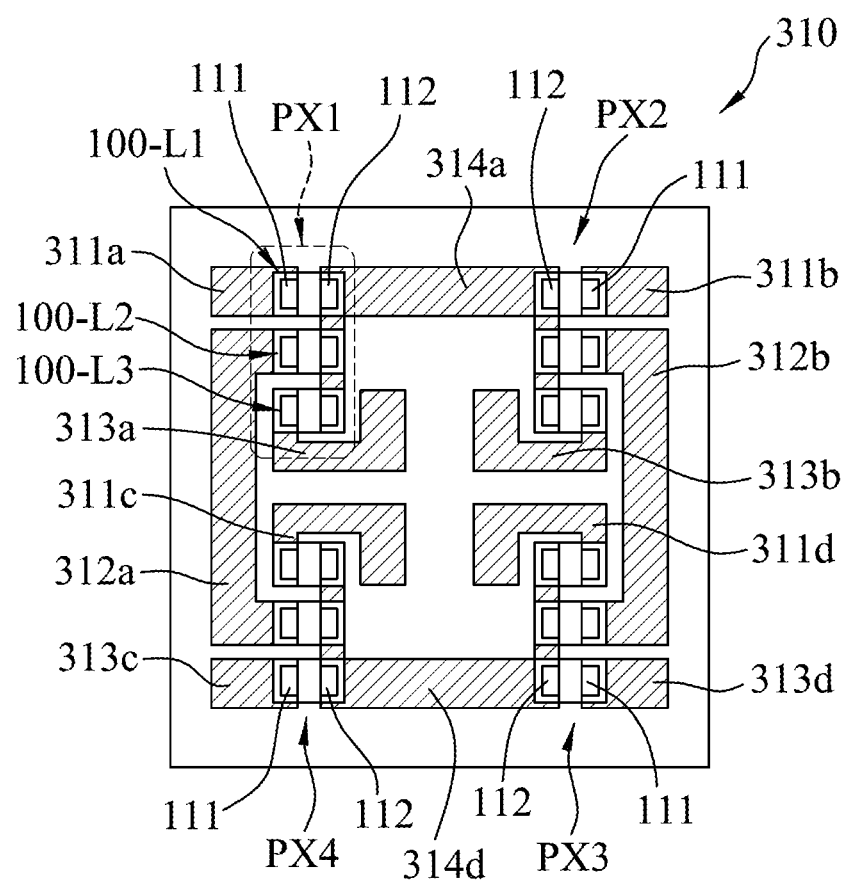
FIG. 7 is a schematic top view illustrating the first wiring layer of the first embodiment of the LED packaging module according to the present disclosure.

The first wiring layer 310 may include a plurality of first wires and a plurality of common wires (e.g., at least two common wires) such that the LED chips 100 of the light-emitting units (PX) are electrically connected and an N-in-one structure is formed (N being a positive integer greater than 1). The first wires may electrically connect the LED chips 100 of the same type (e.g., electrically connecting the first LED chip 100-L1 of one of the light-emitting units (PX) to the first LED chip 100-L1 of another one of the light-emitting units (PX)). For example, the second LED chips 100-L2 of adjacent two of the light-emitting units (PX) arranged in the same column are connected by a corresponding one of the first wires in parallel (see FIG. 7). At least a part of the LED chips 100 of one the light-emitting units (PX) is connected to at least a part of the LED chips 100 of an adjacent one of the light-emitting units (PX) in the same row by a corresponding one of the common wires. Referring to FIG. 7, the first embodiment of the LED packaging module 1000 having a four-in-one structure has four of the light-emitting units (PX1, PX2, PX3, PX4) electrically connected to one another. In some other embodiments, the LED packaging module 1000 may have, for example, but not limited to, a nine-in-one structure, a sixteen-in-one structure, etc., depending on the number of light-emitting units (PX) in the LED packaging module 1000. In FIG. 7, the first wiring layer 310 includes two common wires 314*a*, 314*d* and ten first wires 311*a*, 311*b*, 311*c*, 311*d*, 313*a*, 313*b*, 313*c*, 313*d*, 312*a*, 312*b*. Each of the first wires 311*a*, 311*b*, 311c, 311d are respectively and electrically connected to the first electrode 111 of the first LED chip 100-L1 of each of the PX1, PX2, PX4, PX3. Each of the first wires 313a, 313b, 313c, 313d are respectively and electrically connected to the first electrode 111 of the third LED chip 100-L3 of each of the PX1, PX2, PX4, and PX3. The first wire 312a electrically connects the first electrodes 111 of the second LED chips 100-L2 of the PX1 and PX4 (i.e., the light-emitting units (PX) aligned in a first column). The first wire 312b electrically connects the first electrodes 111 of the second LED chips 100-L2 of the PX2 and PX3 (i.e., the light-emitting units (PX) aligned in a second column). The common wire 314a electrically connects the second electrodes 112 of the first, second, and third LED chips 100-L1, 100-L2, 100-L3 of the PX1, PX2 (i.e., light-emitting units (PX) aligned in a first row). The common wire 314d electrically connects the second electrodes 112 of the first, second, and third LED chips 100-L1, 100-L2, 100-L3 of the PX3, PX4 (i.e., light-emitting units (PX) aligned in a second row).

Figure 8:
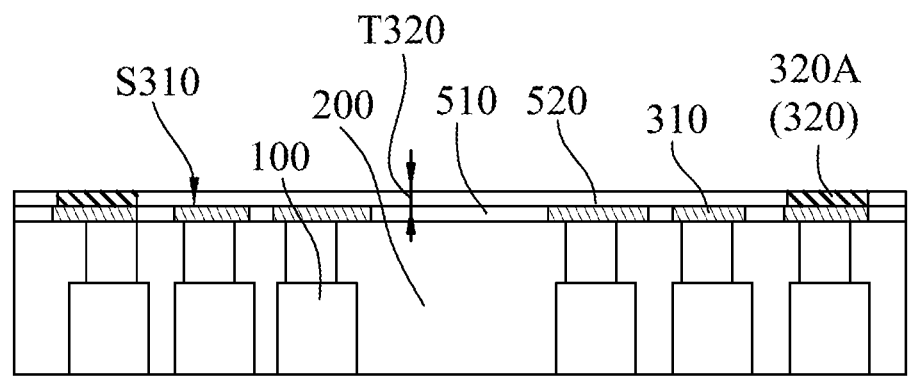
FIG. 8 is a schematic cross-sectional view illustrating a via layer of the first embodiment of the LED packaging module according to the present disclosure.
Figure 9:
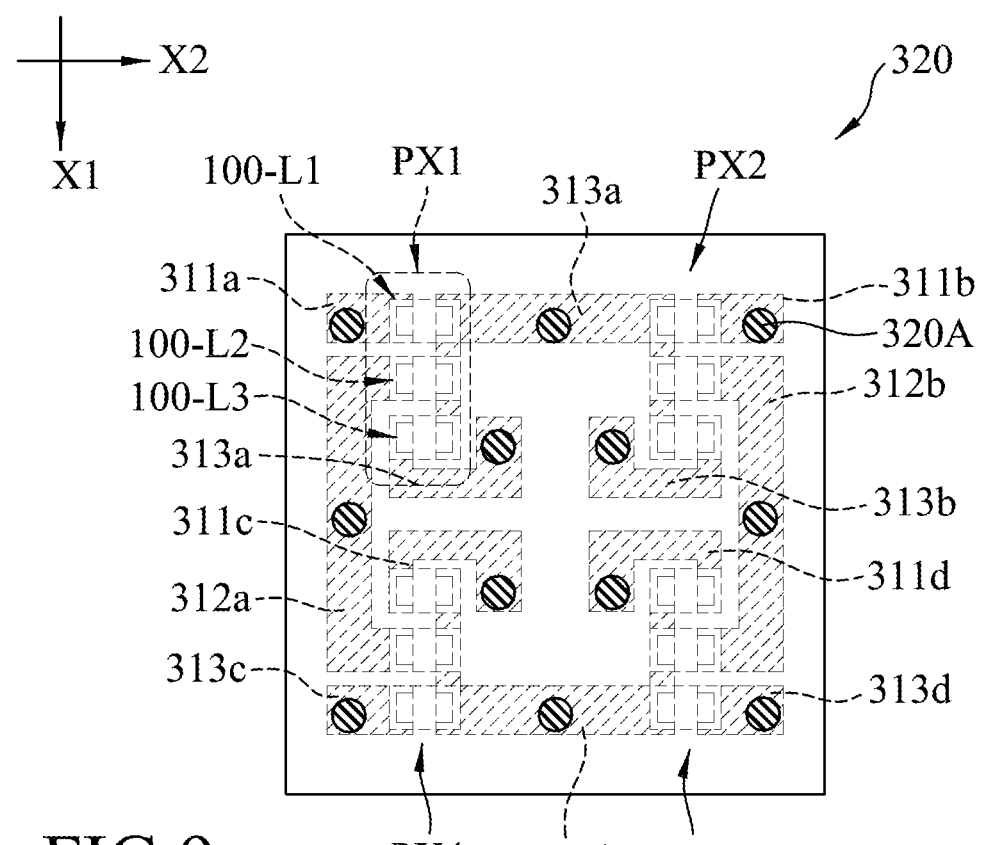
FIG. 9 is a schematic top view illustrating the via layer of the first embodiment of the LED packaging module according to the present disclosure.

Referring to FIGS. 7, 8, and 9, the via layer 320 is disposed on the surface S310 of the first wiring layer 310, and may be obtained by forming a plurality of vias 320A in a second insulation layer 520. The vias 320A are electrically connected to the corresponding wires of the first wiring layer 310. A number and location of the vias 320A depend on the circuit design of the LED packaging module 1000. In FIG. 9, solid slash-filled circles indicate the vias 320A being formed in the second insulation layer 520. The vias 320A are formed to be as far as possible from the LED chips 100-L1, 100-L2, 100-L3. The second insulation layer 520 may be made of a material similar to that of the first insulation layer 510. The via layer 320 may have a thickness T320 that is less than about 100 μm. In certain embodiments where the LED packaging module 1000 has a thinner structure, the thickness T320 of the via layer 320 may range from about 20 μm to about 50 μm or from about 25 μm to about 30 μm, which can avoid excess stress and thermal resistance caused by large thickness. Such design ensures the LED packaging module 1000 is thinner and lighter and has a desired structural strength. In some other embodiments, the thickness T320 of the via layer 320 may range from about 50 μm to about 80 μm (e.g., 60 μm), which can appropriately increase the thickness of the LED packaging module 1000 to thereby increase convenience for picking up the LED packaging module 1000.

Figure 10:
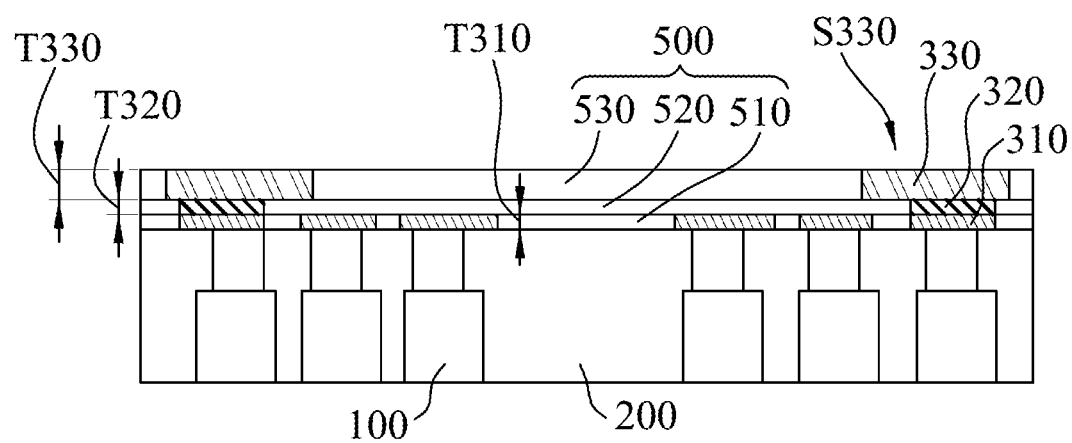
FIG. 10 is a schematic cross-sectional view illustrating a second wiring layer of the first embodiment of the LED packaging module according to the present disclosure.

Referring to FIG. 10, the second wiring layer 330 is disposed on the via layer 320, and is electrically connected to the first wiring layer 310 through the via layer 320. A third insulation layer 530 fills spaces among wirings in the second wiring layer 330, and exposes a surface S330 of the second wiring layer 330 distal from the LED chips 100. The third insulation layer 530 may be made of a material similar to or the same as that of the first insulation layer 510.

In some embodiments, the second wiring layer 330 electrically connects the first LED chips 100-L1 of adjacent two of the light-emitting units (PX) arranged in the same column (i.e., arranged in the first direction), and electrically connects the third LED chips 100-L3 of adjacent two of the light-emitting units (PX) arranged in the same column.

Figure 11:
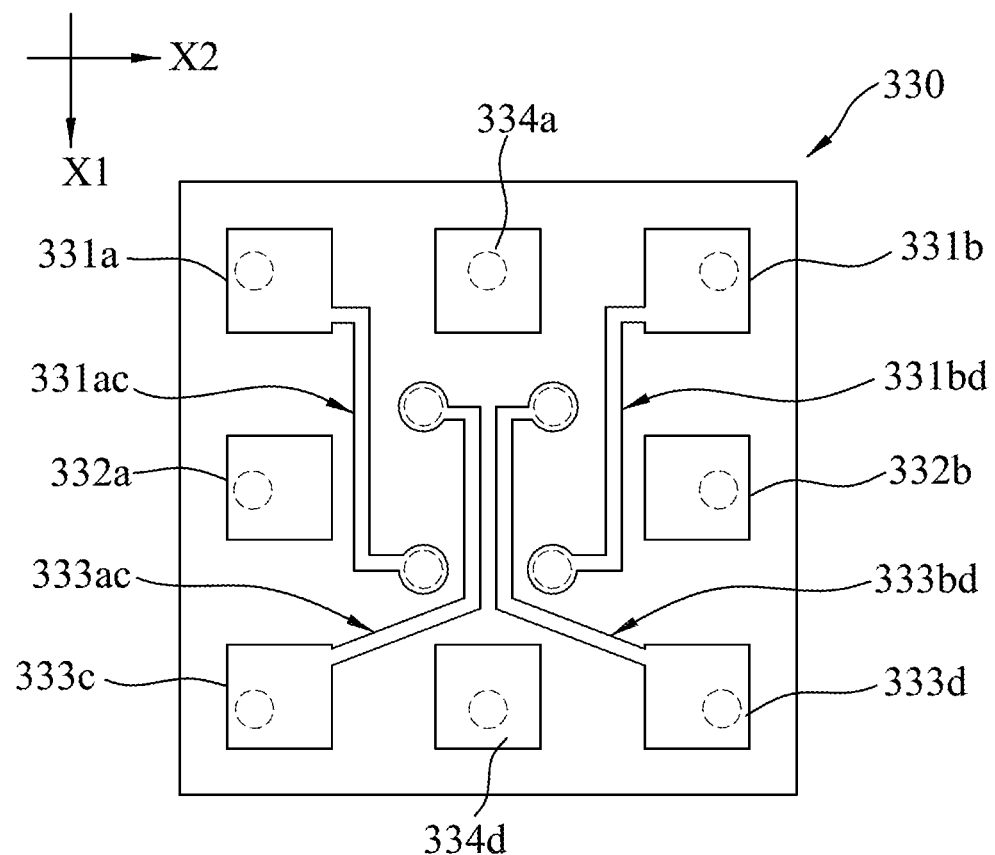
FIG. 11 is a schematic top view illustrating the second wiring layer of the first embodiment of the LED packaging module according to the present disclosure.

Specifically, as shown in FIG. 11, the second wiring layer 330 includes a plurality of wire portions 331ac, 331bd, 333ac, 333bd and a plurality of connecting portions 331a, 331b, 332a, 332b, 333c, 333d, 334a, 334d. The wire portions 331ac, 331bd, 333ac, 333bd are used for electrically connecting same types of electrodes of same types of LED chips 100 (i.e., one of the first LED chip 100-L1, the second LED chip 100-L2, and the third LED chip 100-L3). For example, as shown in FIGS. 7, 9 and 11, the wire portion 331ac, cooperating with the corresponding vias 320A and the first wires 311a, 311c, are electrically connected to the first electrodes 111-L1 of the first LED chips 100-L1 of the PX1 and PX4 that are arranged in the same column (i.e., aligned in the first direction). The wire portion 333ac, cooperating with the corresponding vias 320A and the first wires 313a, 313c, are electrically connected to the first electrodes 111-L1 of the third LED chips 100-L3 of the PX1 and PX4 that are arranged in the same column (i.e., aligned in the first direction). The connecting portions 331a, 331b, 332a, 332b, 333c, 333d, 334a, 334d may serve as welding pads for external connection, e.g., to a power source. In certain embodiments, external welding pads (not shown) may be formed on portions of the second wiring layer 330 corresponding to the connecting portions 331a, 331b, 332a, 332b, 333c, 333d, 334a, 334d, while portions of the second wiring layer 330 not formed with the welding pads are covered by ink, epoxy resin, or other suitable insulation material so as to protect the wirings in the second wiring layer 330. In some embodiments, the connecting portions 331a, 331b, 332a, 332b, 333c, 333d, 334a, 334d completely cover the corresponding vias 320A of the via layer 320, which increases a contact area between the second wiring layer 330 and the via layer 320. In a manufacturing process of the LED packaging module 1000, the via layer 320 and the second wiring layer 330 may be formed in a same step so that an additional step(s) of filling a conductive material and a grinding procedure can be eliminated, which can effectively reduce production cost and increase end product stability.

The first, second, and third insulation layers 510, 520, 530 may be made of same or different material(s). The material may be, for example, but not limited to, epoxy resin, silica gel, polyimide, benzocyclobutadiene, polybenzoxazole (PBO), or the like. When the first, second, and third insulation layers 510, 520, 530 are made of the same material, the first, second, and third insulation layers 510, 520, 530 may be integrally formed into the insulation component 500 and may be difficult to be distinguished. In some embodiments, the first, second, and third insulation layers 510, 520, 530 are made of a material that is opaque or low in light transmission (e.g., epoxy resin or silica gel mixed with a black colorant), so that light may be prevented from being emitted or reflected in the wiring assembly 300, which can avoid optical crosstalk. When the insulation component 500 is made of the material that is opaque or low in light transmission, wirings in the wiring assembly 300 are formed before filling the insulation component 500. After filling the insulation component 500, the insulation component 500 is grinded to expose a surface of the wiring assembly 300. In some other embodiments, when the encapsulating layer 200 is made of a material that is opaque or low in light transmission, at least one of the first, second, and third insulation layers 510, 520, 530 may be made of a light-transmitting material (e.g., at least one of the first, second, and third insulation layers 510, 520, 530 is transparent), so that the first, second, and third insulation layers 510, 520, 530 have a light transmittance greater than that of the encapsulating layer 200. As such, the first, second, and third insulation layers 510, 520, 530 may not include a colorant or a light-absorbing material, such as carbon powder or a dye, and may be made of silica gel or epoxy resin layer not including microparticles (e.g., carbon powder), so as to avoid possible non-uniformity and interface defects caused by the addition of colorants, which may lead to a decrease in reliability (e.g., a decrease in insulation performance). Therefore, the reliability of the insulation component 500 can be ensured. Typically, microparticles are referred to as particles having a diameter of not less than about 1 micron. In yet some other embodiments, the insulation component 500 is made of a photosensitive material through curing, which can simplify the manufacturing process of the LED packaging module 1000. Meanwhile, a light-absorbing material may cover a non-metallic portion of the chip second surface S22 (i.e., a portion of the chip second surface S22 not covered by the electrode assembly 110) and surrounds each of the LED chips 100 to avoid optical crosstalk among the side surfaces S24 of the LED chips 100.

Figure 12:
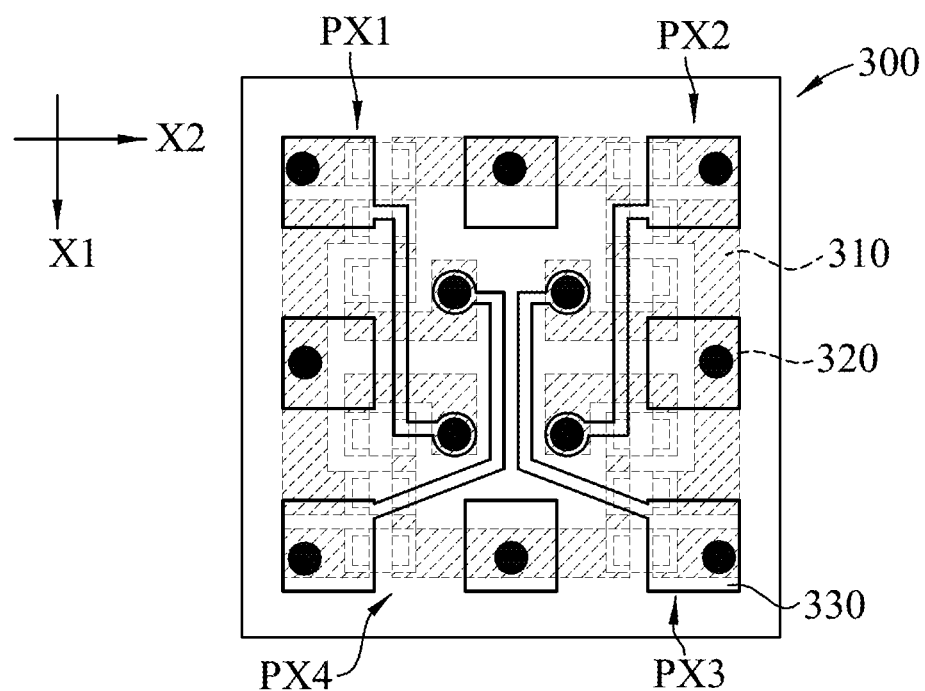
FIG. 12 is a schematic top view illustrating the first wiring layer, the via layer, and the second wiring layer of the first embodiment.
Figure 13:
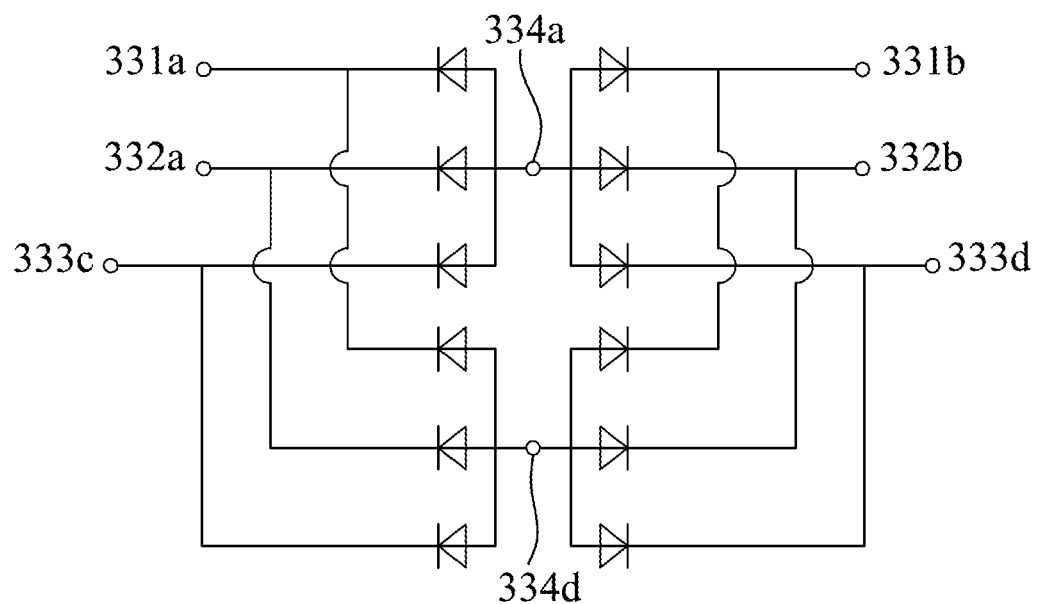
FIG. 13 illustrates a circuit in the first embodiment of the LED packaging module according to the present disclosure.

FIG. 12 illustrates a connection relationship among the first wiring layer 310, the via layer 320, and the second wiring layer 330. FIG. 13 shows a circuit diagram equivalent to that shown in FIG. 12. Referring to FIGS. 12 and 13, the four-in-one structure of the LED packaging module 1000 may be electrically connected to an external device through the connecting portions 331a, 331b, 332a, 332b, 333c, 333d, 334a, 334d. The first electrodes 111-L1 of the first LED chips 100-L1 may be electrically connected to an external device through the connecting portions 331a, 331b. The first electrodes 111-L2 of the second LED chips 100-L2 may be electrically connected to an external device through the connecting portions 332a, 332b. The first electrodes 111-L3 of the third LED chips 100-L3 may be electrically connected to an external device through the connecting portions 333c, 333d. The connecting portions 334a, 334d serve as common electrodes. The connection portion 334a is electrically connected to each of the second electrodes 112-L1, 112-L2, 112-L3 of the first, second, and third LED chips 100-L1, 100-L2, 100-L3 of the PX1 and PX2. The connecting portion 334d is electrically connected to each of the second electrodes 112-L1, 112-L2, 112-L3 of the first, second, and third LED chips 100-L1, 100-L2, 100-L3 of the PX3 and PX4.

In this embodiment, the LED chips 100 of each of the PX1, PX2, PX3, PX4 are arranged to align in the first direction (i.e., arranged in a column). The first electrode 111 and second electrode 112 of each of the LED chips 100 are arranged to align in the second direction perpendicular to the first direction. The second electrodes 112 of the LED chips 100 of one of the PXs are adjacent to the second electrodes 112 of the LED chips 100 of an adjacent one of the PXs in the second direction. In the first wiring layer 310, the first, second, and third LED chips 100-L1, 100-L2, 100-L3 of adjacent ones of the light-emitting units (PX) in the second direction are electrically connected to the connecting portion 334a, 334d. In addition, the second LED chips 100-L2 of adjacent ones of the light-emitting units (PX) in the first direction are electrically connected in parallel. As shown in FIGS. 12 and 13, the first electrodes 111-L1 of the second LED chips 100-L2 of the PX1, PX4 are electrically connected in parallel, and the first electrodes 111-L1 of the second LED chips 100-L2 of the PX2, PX3 are electrically connected in parallel. The first electrodes 111-L1 of the first LED chips 100-L1 and the third LED chips 100-L3 of PX1, PX2, PX3, PX4 are electrically connected to the first wires 311a, 311b, 311c, 311d, 313a, 313b, 313c, 313d, respectively. In this embodiment, the number of electrode terminals can be reduced to twelve in the four-in-one structure of the LED packaging module 1000. In the second wiring layer 330, the first LED chips 100-L1 of adjacent two of the light-emitting units arranged in the same column are electrically connected in parallel by a corresponding one of the connecting portions. That is, the first electrodes 111-L1 of the first LED chips 100-L1 of PX1 and PX4 are connected in parallel by the connecting portion 331a; the first electrodes 111-L1 of the first LED chips 100-L1 of PX2 and PX3 are connected in parallel by the connecting portion 331b. The third LED chips 100-L3 of adjacent two of the light-emitting units arranged in the same column are electrically connected in parallel by a corresponding one of the connecting portions. That is, the first electrodes 111-L1 of the third LED chips 100-L3 of PX1 and PX4 are connected in parallel by the connecting portion 333c; the first electrodes 111-L1 of the third LED chips 100-L3 of PX2 and PX3 are connected in parallel by the connecting portion 333d. Thus, the four-in-one structure has 8 connecting portions 331a, 331b, 332a, 332b, 333c, 333d, 334a, 334d serving as electrode terminals. Such design reduces an amount of welding pads needed in the LED packaging module 1000, and brings convenience for connection of the LED packaging module 1000 to an external device(s).

The first embodiment of the LED packaging module 1000 does not have a substrate or a bracket for supporting the LED chips 100, and the light-emitting units (PX) arranged in the m×n array are mainly fixed by the encapsulating layer 200, the light-transmitting layer 400, the insulation component 500, and the wiring assembly 300. As shown in FIG. 2, the LED packaging module 1000 has a thickness T that is mainly determined by a thickness $T_A$ of the LED chips 100 and a thickness $T_C$ of the wiring assembly 300. In some embodiments, the thickness T of the LED packaging module 1000 may range from about 100 μm to about 500 μm. The encapsulating layer has a thickness $T_B$. In certain embodiments, $T_B/T_A \geq 1$. In some embodiments, the LED chips 100 are mini LED chips such that the thickness $T_A$ of the LED chips 100 ranges from about 40 μm to about 150 μm (in certain embodiments, $T_A$ ranges from about 50 μm to about 120 μm), the thickness $T_C$ of the wiring assembly 300 ranges from about 20 μm to about 200 μm (in some embodiments, $T_C$ ranges from about 50 μm to about 150 μm), and T and $T_A$ satisfy a relationship: $1.4 \leq T/T_A \leq 10$. Meeting such relationship can prevent the wiring assembly 300 from being too thick, and from having excess stress and thermal resistance. As such, a thickness T of the LED packaging module 1000 can be reduced while ensuring the strength of the LED packaging module 1000. For example, in some embodiments, the thickness $T_A$ of the LED chips 100 is about 80 μm, and the thickness T ranges from about 120 μm to about 200 μm). In this case, the interconnecting layers of the wiring assembly 300 (i.e., the first wiring layer 310, the via layer 320, and the second wiring layer 330) may each have a thickness that ranges from about 20 μm to about 50 μm (e.g., about 30 μm). In some other embodiments, when the size of the LED packaging module 1000 is small (for example, 0.4 mm×0.4 mm or smaller), the LED packaging module 1000 may be inconvenient to pick up from an upper surface of the LED packaging module 1000. In this case, the thickness T of the LED packaging module 1000 can be appropriately increased so that a sidewall of the LED packaging module 1000 has a larger area so as to allow a pickup device to be easily in contact with and pick up the LED packaging module 1000. The thickness T of the LED packaging module 1000 may range from about 320 μm to about 500 μm (in certain embodiments, from about 340 μm to about 360 μm). The thickness T of the LED packaging module 1000 may be increased by increasing the thickness $T_A$ of the LED chips 100 and/or the thickness $T_C$ of the wiring assembly 300. The thickness T of the LED packaging module 1000 may be increased by increasing a thickness of the first and second electrodes 111, 112. The thickness $T_C$ of the wiring assembly 300 may be increased by increasing a thickness of the via layer 320 to range from about 30 µm to about 80 µm, and/or a thickness of each of the first and second wiring layers 310, 330 to range from about 50 µm to about 100 µm. In some embodiments, the LED chips 100 are micro LED chips such that the thickness $T_A$ of the LED chips 100 ranges from about 5 µm to about 10 µm and the thickness $T_C$ of the wiring assembly 300 ranges from about 20 µm to about 200 µm (in certain embodiments, from about 50 µm to about 150 µm), and T and $T_A$ satisfy the relationship: $10 \leq T/T_A \leq 60$. In certain embodiments, the thickness T of the LED packaging module 1000 may range from about 50 µm to about 100 µm, or from about 100 µm to about 200 µm.

In some embodiments of the present disclosure, the array of the light-emitting units (PX) includes at least two rows and at least two columns. The second wiring layer 330 electrically connects the first electrodes 111-L1 of the first LED chips 100-L1 of at least two of the light-emitting units (PX) arranged in the same row, and the second wiring layer 330 electrically connects the first electrodes 111-L2 of the second LED chips 100-L2 of at least two of the light-emitting units (PX) arranged in the same row. The second wiring layer 330 electrically connects the first electrodes 111-L3 of the third LED chips 100-L3 of at least two of the light-emitting units (PX) arranged in the same row. The first wiring layer 310 electrically connects the second electrodes 112 of the first, second and third LED chips 100-L1, 100-L2, 100-L3 of the light-emitting units (PX) arranged in the same column. In certain embodiments, at least a part of the first LED chips 100-L1 of the light-emitting units (PX) arranged in the same column are electrically connected by a corresponding one of the wire portions in parallel. The second LED chips 100-L2 of the light-emitting units (PX) arranged in the same row are connected by a corresponding one of the wire portions in parallel. The third LED chips 100-L3 of the light-emitting units (PX) arranged in the same column are connected by a corresponding one of the wire portions in parallel.

Figure 14:
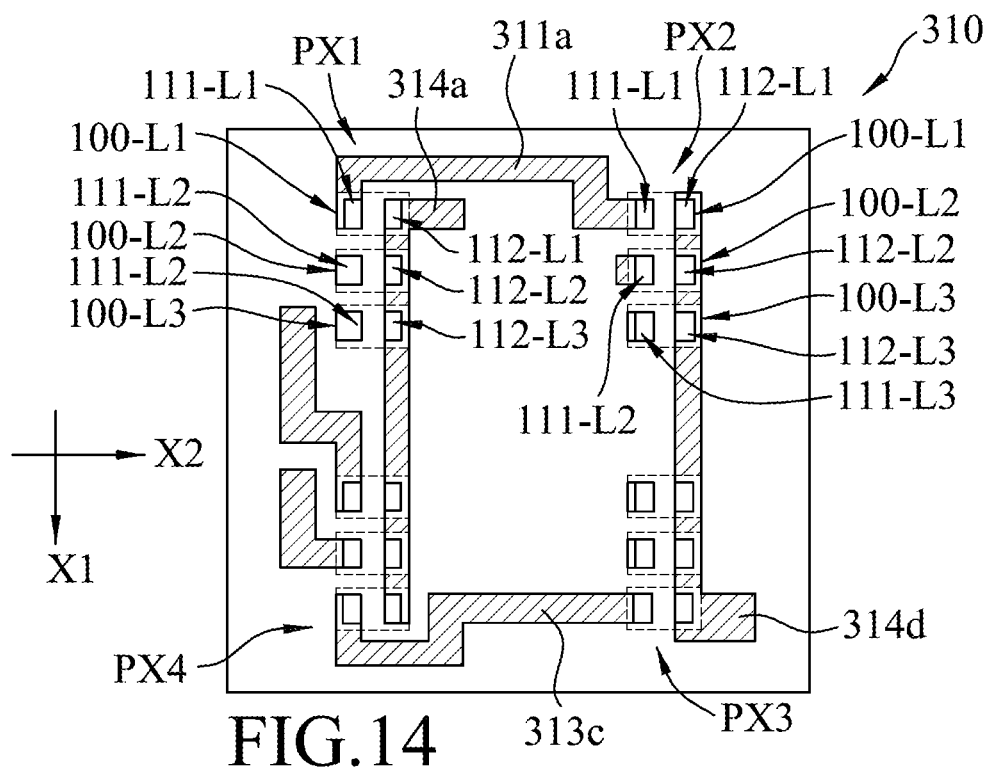
FIG. 14 is a schematic top view illustrating the first wiring layer of a second embodiment of the LED packaging module according to the present disclosure.

FIGS. 14 to 17 illustrate a second embodiment of the LED packaging module 1000 of the present disclosure. The second embodiment of the LED packaging module 1000 is similar to the first embodiment except for differences disclosed hereinafter. Referring to FIG. 14, the light-emitting units PX1, PX2, PX3, and PX4 of the second embodiment of the LED packaging module 1000 are arranged in an m×n array (2×2 in this embodiment) similar to that of the first embodiment. The first and second electrodes 111, 112 of each of the LED chip 100 are aligned in the second direction, and the arrangement of the first and second electrodes 111, 112 of the LED packaging module 1000 in one column is the same as that in an adjacent column (i.e., not in mirror-symmetrical arrangement). That is, the first electrodes 111 of the first, second, and third LED chips 100-L1, 100-L2, 100-L3 of one of the light-emitting units (PX) are adjacent to the second electrodes 112 of the first, second, third LED chips 100 of an adjacent one of the light-emitting units (PX) in the second direction. For example, in the second embodiment, the second electrodes 112 of the first, second, and third LED chips 100-L1, 100-L2, 100-L3 of the PX1 are adjacent to the first electrodes 111 of the first, second, and third LED chips 100-L1, 100-L2, 100-L3 of the PX2. Such design is conducive to improving efficiency and precision of LED chip arrangement.

In the second embodiment, the first wiring layer 310 includes a plurality of the first wires 311a, 313c and a plurality of the common wires 314a, 314d. The light-emitting units (i.e., the PX1, PX2, PX3, PX4) are divided in a first group (including PX1 and PX2) and a second group (including PX3 and PX4). The first group and the second group are arranged along the first direction. In the first group, the first LED chips 100-L1 of the light-emitting units PX1 and PX2 arranged in the same row are connected by the first wire 311a in parallel. In the second group, the third LED chips 100-L3 of the light-emitting units PX3 and PX4 arranged in the same row are connected by the first wires 313c in parallel. The first wire 311a connects the first electrodes 111-L1 of the first LED chips 100-L1 of the PX1 and PX2, and the first wire 313c connects the first electrodes 111-L3 of the third LED chips 100-L3 of the PX3 and PX4. At least a part of the LED chips 100-L1, 100-L2, 100-L3 of one of the light-emitting units (PX) is connected to at least a part of the LED chips 100-L1, 100-L2, 100-L3 of an adjacent one of the light-emitting units (PX) arranged in the same column by a corresponding one of the common wires 314a, 314d. For example, the common wire 314a connects the second electrodes 112-L1, 112-L2, 112-L3 of the first, second, and third LED chips 100-L1, 100-L2, 100-L3 of the PX1 and PX4, and the common wire 314d connects the second electrodes 112-L1, 112-L2, 112-L3 of the first, second, and third LED chips 100-L1, 100-L2, 100-L3 of the PX2 and PX3.

Figure 15:
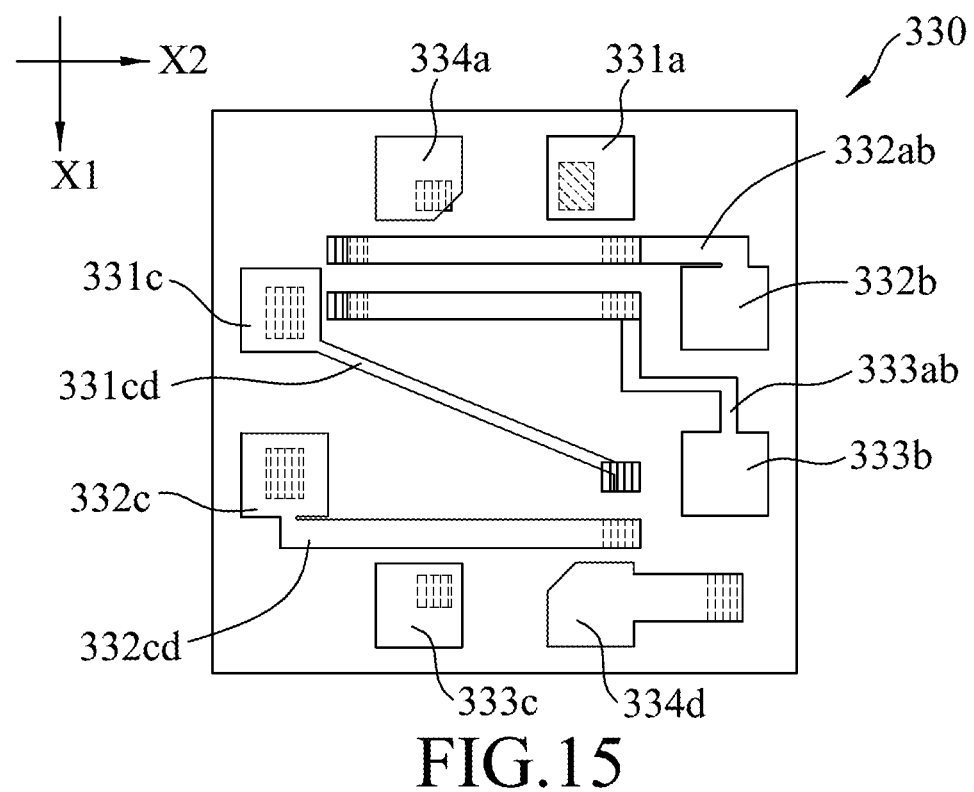
FIG. 15 is a schematic top view illustrating the second wiring layer of the second embodiment of the LED packaging module according to the present disclosure.
Figure 16:
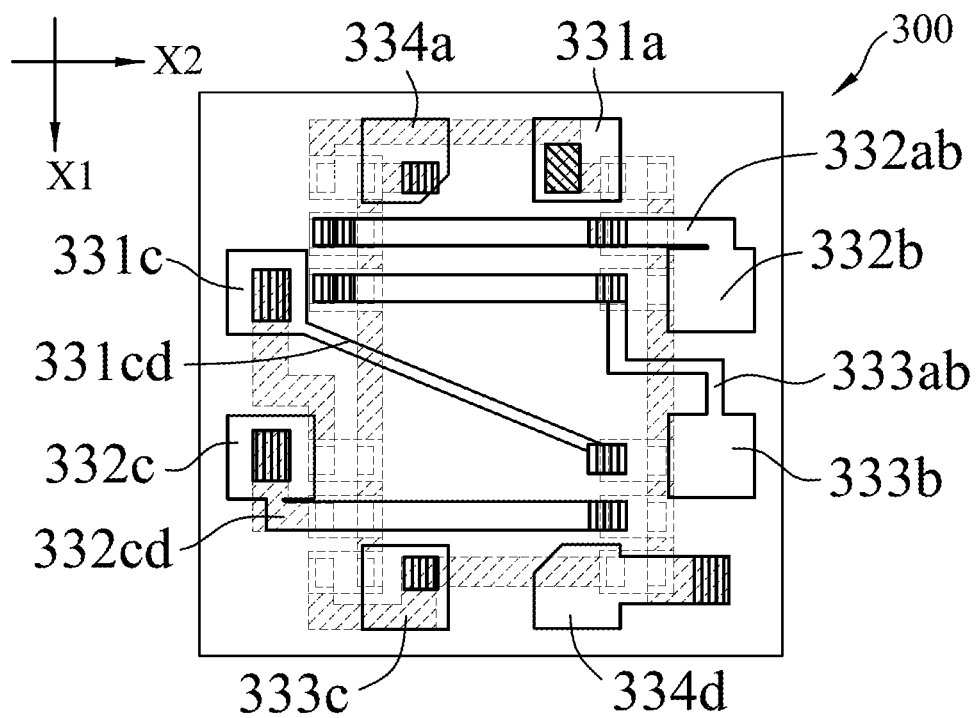
FIG. 16 is a schematic top view illustrating the first wiring layer, the via layer, and the second wiring layer of the second embodiment.
Figure 17:
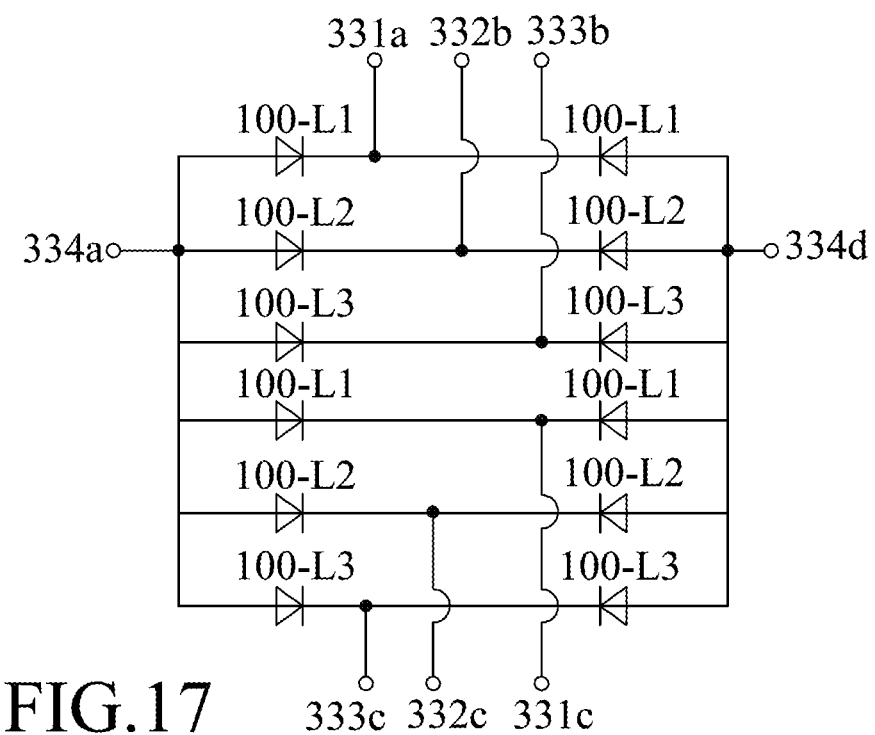
FIG. 17 illustrates a circuit in the second embodiment of the LED packaging module according to the present disclosure.

Referring to FIGS. 15 and 16, in the second embodiment, the second wiring layer 330 electrically connects the first LED chips 100-L1 of adjacent two of the light-emitting units (PX) arranged in the same row in the second group. The second wiring layer 330 electrically connects the second LED chips 100-L2 of adjacent two of the light-emitting units (PX) arranged in same row in each of the first and second groups. The second wiring layer 330 electrically connects the third LED chips 100-L3 of adjacent two of the light-emitting units (PX) arranged in the same row in the first group. The second wiring layer 330 includes a plurality of the connecting portions 331a, 331c, 332b, 332c, 333b, 333c, 334a, 334d, and the wire portions 331cd, 332ab, 332cd, 333ab. The wire portion 331cd connects first electrodes 111-L1 of the first LED chips 100-L1 of adjacent two of the light-emitting units in the second group (i.e., PX3 and PX4). The wire portion 332cd connects the first electrodes 111-L2 of the second LED chips 100-L2 of adjacent two of the light-emitting units in the second group (i.e., PX3 and PX4). The wire portion 332ab connects the first electrodes 111-L2 of the second LED chips 100-L2 of adjacent two of the light-emitting units in the first group (i.e., PX1 and PX2). The wire portion 333ab connects the first electrodes 111-L3 of the third LED chips 100-L3 of adjacent two of the light-emitting units (PX) in the first group (i.e., PX1 and PX2). FIG. 17 shows an equivalent circuit diagram of the four-in-one structure of the second embodiment. It is shown that: (i) the first LED chip 100-L1 of one of the light-emitting units (PX) is electrically connected, in parallel, to the first LED chip 100-L1 of an adjacent one of the light-emitting units (PX) arranged in the same column, (ii) the second LED chip 100-L2 of one of the light-emitting units (PX) is electrically connected, in parallel, to the second LED chip 100-L2 of an adjacent one of the light-emitting units (PX) arranged in the same column, and (iii) the third LED chip 100-L3 of one of the light-emitting units (PX) is electrically connected, in parallel, to the third LED chip 100-L3 of an adjacent one of the light-emitting units (PX) arranged in the same column. To be specific, the connecting portion 334a is connected to all of the LED chips 100 of the light-emitting units (PX1, PX4) arranged in one column, and the connecting portion 334d is connected to all of the LED chips 100 of the light-emitting units (PX2, PX3) arranged in another column. The connecting portions 331*a*, 331*c*, 332*b*, 332*c*, 333*b*, 333*c* are electrically connected to the same types of the LED chips 100 of the light-emitting units (PX) arranged in the same row, respectively. For example, the connecting portion 331*a* is electrically connected to the first LED chips 100-L1 (i.e., the same type of the LED chips 100) of the light-emitting units (PX) arranged in the same row through the first wire 311*a*. In some embodiments, the connecting portions may be used as external electrodes.

Figure 18:
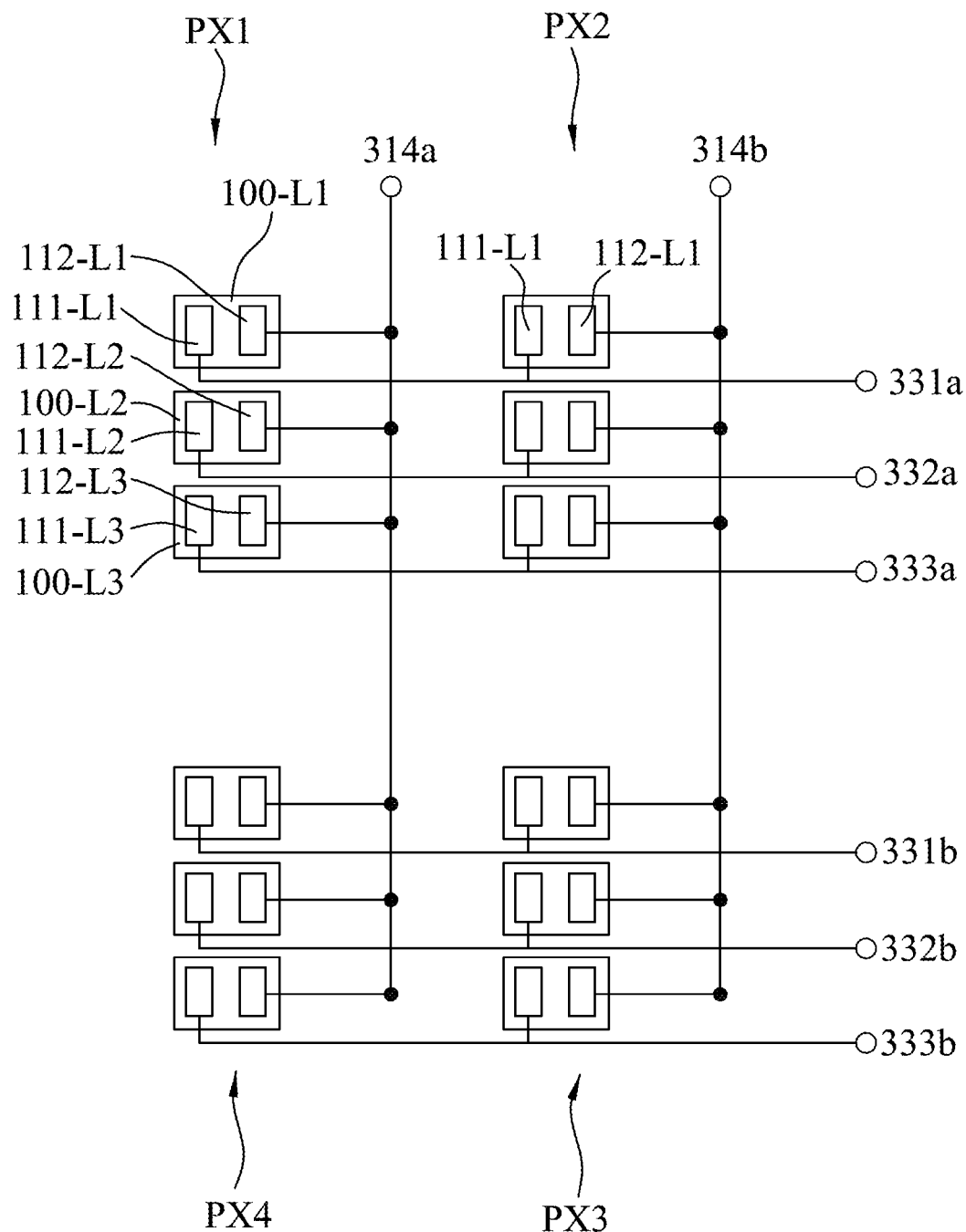
FIG. 18 is a schematic circuit diagram of a third embodiment of the LED packaging module according to the present disclosure.

FIG. 18 illustrates a circuit diagram of a third embodiment of the LED packaging module 1000 of the present disclosure. The third embodiment of the LED packaging module 1000 may be similar to the second embodiment, except for differences disclosed hereinafter. The third embodiment of the LED packaging module 1000 has the light-emitting units (PX) arranged in a 2×2 array (similar to the arrangement of the LED chips 100 in the first and second embodiments). In the third embodiment, the first wiring layer 330 includes conductive wires 314*a*, 314*b* (see FIG. 18) which are respectively connected to the second electrodes 112-L1, 112-L2, 112-L3 of all of the LED chips 100 of the light-emitting units (PX) arranged in left and right columns as shown in FIG. 18. The second wiring layer 330 includes conductive wires 331*a*, 332*a*, 333*a*, 331*b*, 332*b*, 333*b* (see FIG. 18) which are respectively connected to the first electrodes 111 of the same types of the LED chips 100 in the light-emitting units (PX) arranged in the same rows. For example, the conductive path 331*a* is electrically connected to the first electrodes 111-L1 of the first LED chips 100-L1 in the light-emitting units (PX) arranged in the same row (i.e., PX1 and PX2), the conductive path 332*a* is connected to the first electrodes 111-L2 of the second LED chips 100-L2 in the light-emitting units (PX) arranged in the same row (i.e., PX1 and PX2), and the conductive path 331*b* is connected to the first electrodes 111-L1 of the first LED chips 100-L1 in the light-emitting units (PX) arranged in the same row (i.e., PX3 and PX4). The first wiring layer 310 and the second wiring layer 330 are electrically connected with each other through the via layer 320. Configurations of the first wiring layer 310 and the second wiring layer 330 may be interchangeable, and are not limited to those described above. For example, the first wiring layer 310 may include the conductive wires 331*a*, 332*a*, 333*a*, 331*b*, 332*b*, 333*b* which are correspondingly connected to the first electrodes 111, and the second wiring layer 330 may include the conductive wires 314*a*, 314*b* which are correspondingly connected to the second electrodes 112.

Figure 19:
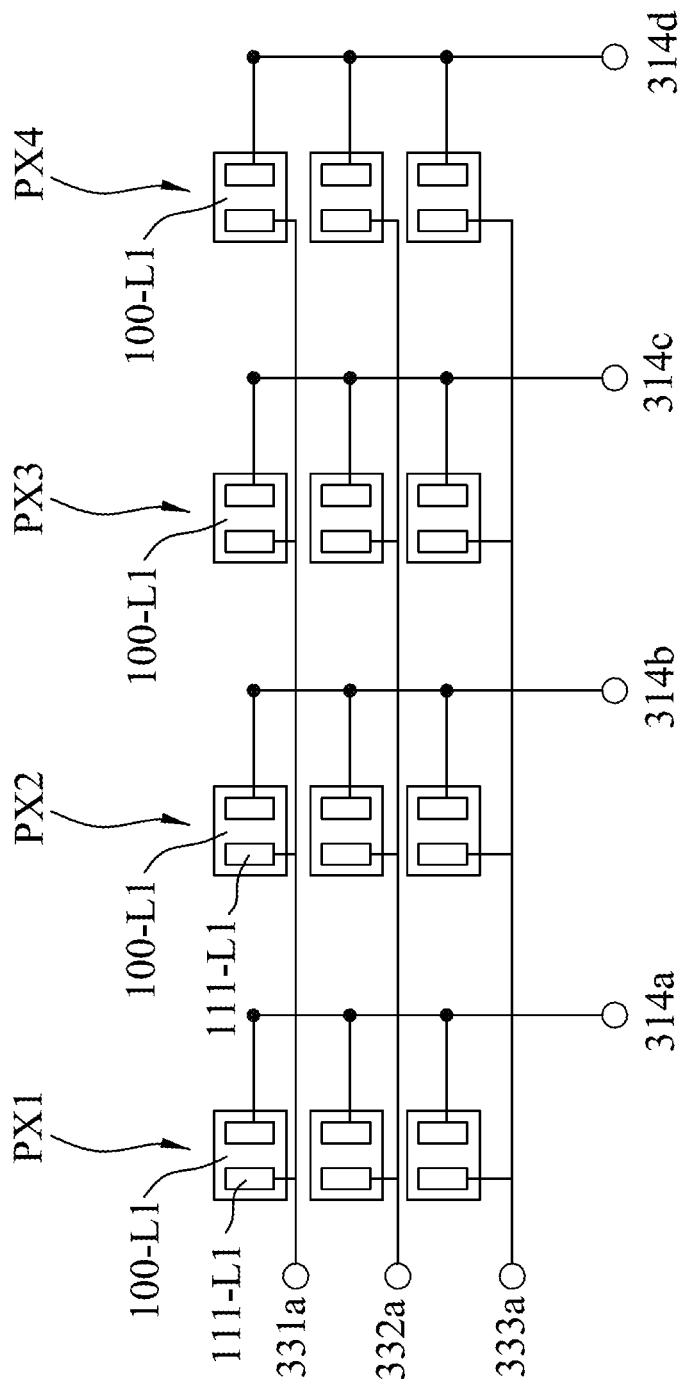
FIG. 19 is a schematic circuit diagram of a fourth embodiment of the LED packaging module according to the present disclosure.

FIG. 19 illustrates a fourth embodiment of the LED packaging module 1000 of the present disclosure. The fourth embodiment has the light-emitting units PX1, PX2, PX3, PX4 arranged in a 1×4 array (i.e., the PX1, PX2, PX3, PX4 are arranged in a row). The LED chips 100 in each of the PX1, PX2, PX3, PX4 are arranged in a row (i.e., arranged in the second direction (X2)). The LED packaging module 1000 may have a substantially rectangular shape, which can be easily assembled when applied to a display device, and an amount of welding pads required can be minimized through circuit design. In the fourth embodiment, the first wiring layer 310 has conductive wire 314*a*, 314*b*, 314*c*, 314*d*, each of which connects to the second electrodes 112-L1, 112-L2, 112-L3 of all of the LED chips 100 in a respective one of the PX1, PX2, PX3, PX4 in parallel, thereby forming, four external electrode terminals. For example, the conductive wire 314*a* connects to the second electrodes 112 of the first, second, and third LED chips 100-L1, 100-L2, 100-L3 in the PX1. The second wiring layer 330 has conductive wires 331*a*, 332*a*, 333*a*, each of which connects to the first electrodes 111 of the same type of the LED chips 100 of the light-emitting units (PX). Thus, three external electrode terminals are formed. For example, the conductive wire 331*a* is connected to the first electrodes 111-L1 of the first LED chips 100-L1 of the PX1, PX2, PX3, and PX4, so that the PX1, PX2, PX3, PX4 are formed into a four-in-one structure.

In the fourth embodiment, the LED packaging module 1000 having the four-in-one structure has the PX1, PX2, PX3, and PX4 arranged in a 1×4 array (i.e., an m×n array including 1 row and 4 columns, where m=1 and n=4). When the number of columns (n) is not less than the number of rows (m) in the m×n array of the light-emitting units (PX) (i.e., n≥m), an amount of the connecting portions required in the LED packaging module 1000 can be determined by a formula: Z=n+m×y, where Z refers to an amount of the connecting portions in the LED packaging module 1000, n refers to a number of row(s) in the m×n array, m refers to a number of column(s) in the m×n array, and y refers to an amount of the LED chips 100 in a single light-emitting unit (PX). For example, in the fourth embodiment, when each of the light-emitting units (PX1, PX2, PX3, PX4) has three LED chips 100 (e.g., a red LED chip 100-L1, a green LED chip 100-L2, and a blue LED chip 100-L3), using the formula Z=n+m×y, it can be calculated that only 7 connecting portions (314*a*, 314*b*, 314*c*, 314*d*, 331*a*, 332*a*, 333*a*) are required in the LED packaging module 1000 (m=1, n=4, y=3, and thus, Z=7). The formula Z=n+m×y may be changed to Z=m+n×y when m≥n. In addition, when the number of rows (n) is not less than the number of columns (m) in the m×n array of the light-emitting units (PX) (i.e., n≥m), an amount of external welding pad(s) (not shown) required for the LED packaging module 1000 can be determined by a formula: P=n+m×y, where P refers to the amount of external welding pads required, n refers to a number of row(s) in the m×n array, m refers to a number of column(s) in the m×n array, and y refers to an amount of the LED chips 100 in a single light-emitting unit (PX). For example, in the fourth embodiment, when each of the light-emitting units has three LED chips 100 (e.g., a red LED chip 100-L1, a green LED chip 100-L2, and a blue LED chip 100-L3), using the formula P=n+m×y, it can be calculated that only 7 external welding pads are required (m=1, n=4, y=3, and thus, P=7). The formula P=n+m×y may be changed to P=m+n×y when m≥n. With such design, the amount of the connecting portions and external welding pads may be minimized, which reduces a size of the LED packaging module 1000, facilitates wiring in the LED packaging module 1000 and connection to an external device, and reduces a risk of short circuiting the LED packaging module 1000.

In some embodiments, the light-emitting units (PX) in the LED packaging module 1000 are arranged in an array having m row(s) and n column(s), where m and n each independently represents a positive integer, n being not less than 2, and m×n being not less than 2. In addition, arrangement of the first electrode 111 and the second electrode 112 of each of the LED chips 100 in one of the n columns is symmetrical to that in an adjacent one of the n columns.

Figure 20:
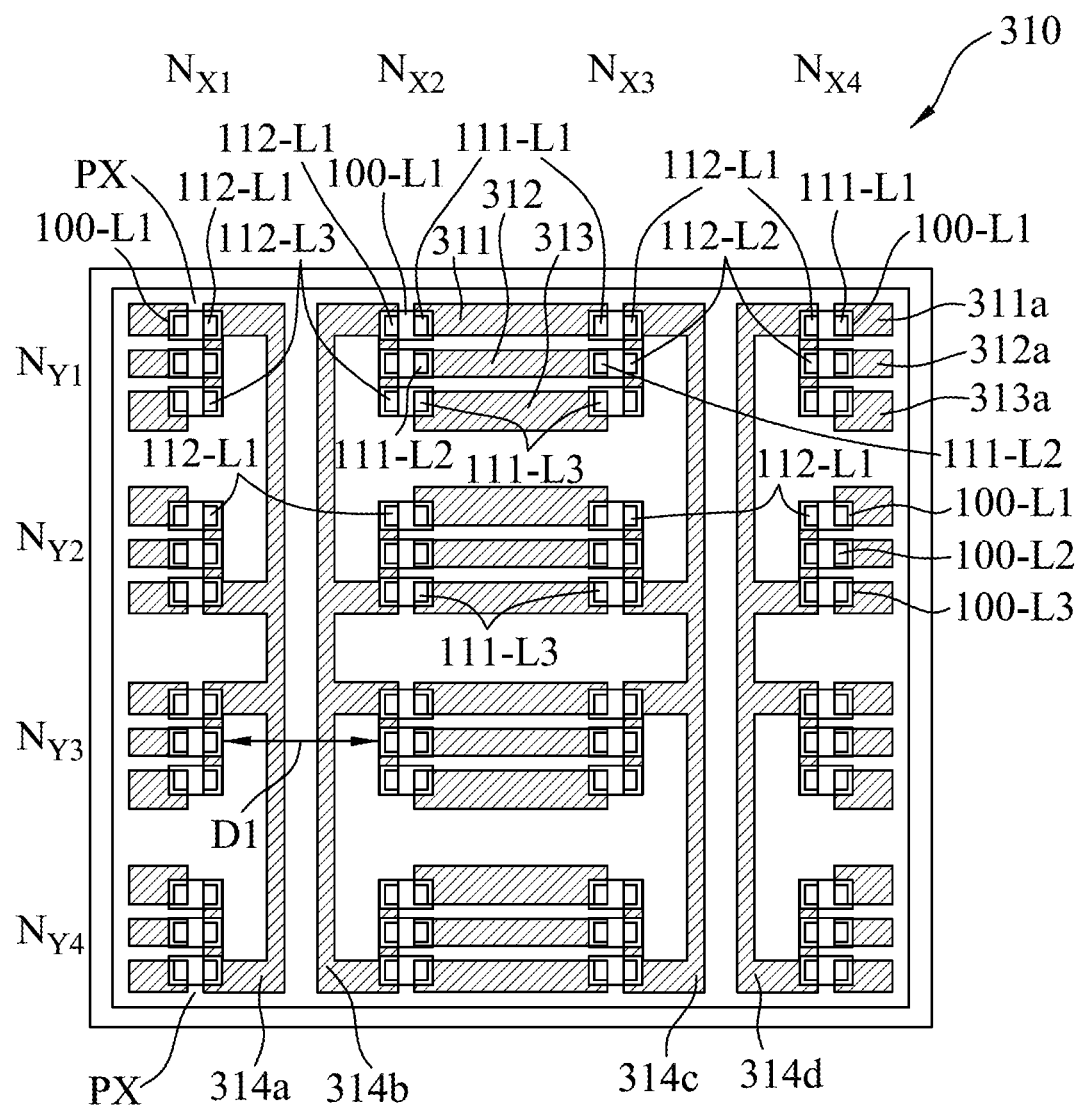
FIG. 20 is a schematic top view illustrating the first wiring layer of a fifth embodiment of the LED packaging module according to the present disclosure.
Figure 21:
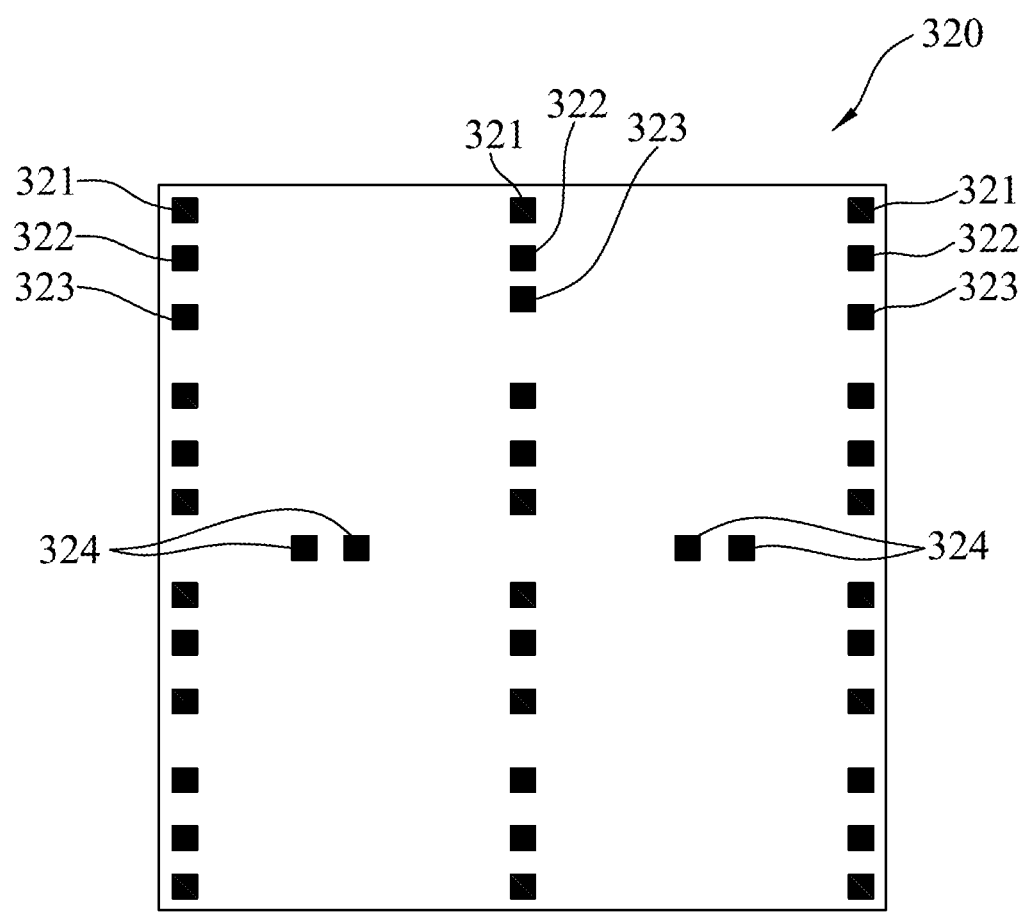
FIG. 21 is a schematic top view illustrating the via layer of the fifth embodiment of the LED packaging module according to the present disclosure.
Figure 22:
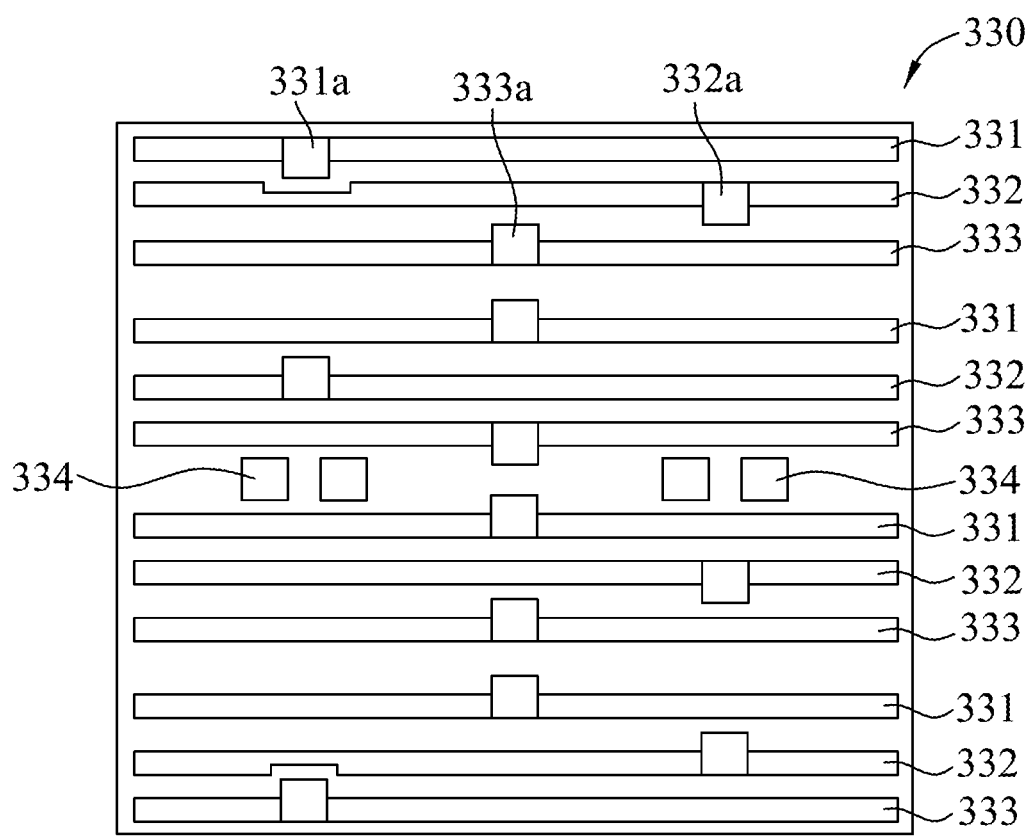
FIG. 22 is a schematic top view illustrating the second wiring layer of the fifth embodiment of the LED packaging module according to the present disclosure.

FIGS. 20 to 22 respectively illustrate the first wiring layer 310, the via layer 320, and the second wiring layer 330 of a fifth embodiment of the present disclosure. FIG. 20 shows an arrangement of the LED chips 100 and the first wiring layer 310 of the fifth embodiment of the LED packaging module 1000. The fifth embodiment includes 16 light-emitting units (PX), which are arranged in a 4×4 array. In the 16-in-1 LED packaging module 1000, a pitch (D1) between two adjacent ones of the light-emitting units (PX) ranges from about 0.1 mm to about 0.5 mm (in some embodiments, from about 0.2 mm to about 0.5 mm). The LED chips 100 of each of the light-emitting units (PX) are arranged in a column (i.e., arranged in the first direction (X1)), and the first and second electrodes 111, 112 of each of the LED chips 100 are arranged to align in the second direction (X2). The first and second directions X1, X2 are substantially perpendicular to each other. The first electrodes 111 of the same type of the LED chips 100 in the same row are connected in parallel. The second electrodes 112 of all of the LED chips 100 in the same column are connected in parallel. The first electrodes 111 of the LED chips 100 of one of the light-emitting units (PX) are adjacent to the first electrodes 111 of the LED chips 100 of an adjacent one of the light-emitting units (PX) in the second direction. The second electrodes 112 of the LED chips 100 of one of the light-emitting units (PX) are adjacent to the second electrodes 112 of the LED chips 100 of an adjacent one of the light-emitting units (PX) in the second direction. Such design is convenient for connecting the first electrodes 111 of the same type of the LED chips 100 in the same row in parallel, and can simplify wiring arrangement of the wiring assembly 300. In the fifth embodiment, the first wiring layer 310 has the common wires 314*a*, 314*b*, 314*c*, 314*d*, each of which connects to the second electrodes 112 of all of the LED chips 100 of the light-emitting units in a respective one of columns $N_{X1}$, $N_{X2}$, $N_{X3}$, $N_{X4}$. The first wiring layer 310 further has first wires 311, 312, 313. In the adjacent columns $N_{X2}$ and $N_{X3}$, each of the first wires 311 connects corresponding two of the first electrodes 111-L1 of the first LED chips 100-L1 in the same row, each of the first wires 312 connects corresponding two of the first electrodes 111-L2 of the second LED chips 100-L2 in the same row, and each of the first wires 313 connects corresponding two of the first electrodes 111-L3 of the third LED chips 100-L3 in the same row. The first wiring layer 310 further has first wires 311*a*, 312*a*, 313*a* which respectively connect to the first electrodes 111 of the first, second, and third LED chips 100-L1, 100-L2, 100-L3 in columns $N_{X1}$, $N_{X4}$. For example, in columns $N_{X1}$ and $N_{X4}$, each of the first wires 311*a* is connected connect to the first electrodes 111-L1 of the first LED chips 100-L1 in the same row. FIG. 21 illustrates a pattern of the via layer 320 of the fifth embodiment, which includes a plurality of vias 321, 322, 323, 324. The second wiring layer 330 connects to the common wires 314*a*, 314*b*, 314*c*, 314*d* of the first wiring layer 310 through the vias 324. The second wiring layer 330 connects to the first wires 311, 312, 313, 311*a*, 312*a*, 313*a* through the vias 321, 322, 323. FIG. 22 illustrates a pattern of the second wiring layer 330 of the fifth embodiment, which includes wiring portions 331, 332, 333 and connecting portions 331*a*, 332*a*, 333*a*, 334. Each of the wiring portions 331 connects to the first electrodes 111-L1 of the first LED chips 100-L1 in a corresponding one of the rows $N_{Y1}$, $N_{Y2}$, $N_{Y3}$, $N_{Y4}$ in parallel. Each of the wiring portions 332 connects to the first electrodes 111-L1 of the second LED chips 100-L2 in a corresponding one of the rows $N_{Y1}$, $N_{Y2}$, $N_{Y3}$, $N_{Y4}$ in parallel. Each of the wiring portions 333 connects to the first electrodes 111-L1 of the third LED chips 100-L3 in a corresponding one of the rows $N_{Y1}$, $N_{Y2}$, $N_{Y3}$, $N_{Y4}$ in parallel. The connecting portions 331*a*, 332*a*, 333*a*, 334 serve as external connection terminals. The connecting portions 331*a*, 332*a*, 333*a* connect respectively to the first wires 311, 312, 313. Each of the connecting portions 334 connects respectively to the common wires 314*a*, 314*b*, 314*c*, 314*d* of the first wiring layer 310 through a corresponding one of the vias 324. In some embodiments, welding pads (not shown) may be formed on the connecting portions 331*a*, 332*a*, 333*a*, 334, and remaining regions of the LED packaging module 1000 not formed with the welding pads may be covered with, for example, ink, epoxy resin, or other insulating materials, so as to protect wirings of the second wiring layer 330.

Figure 23:
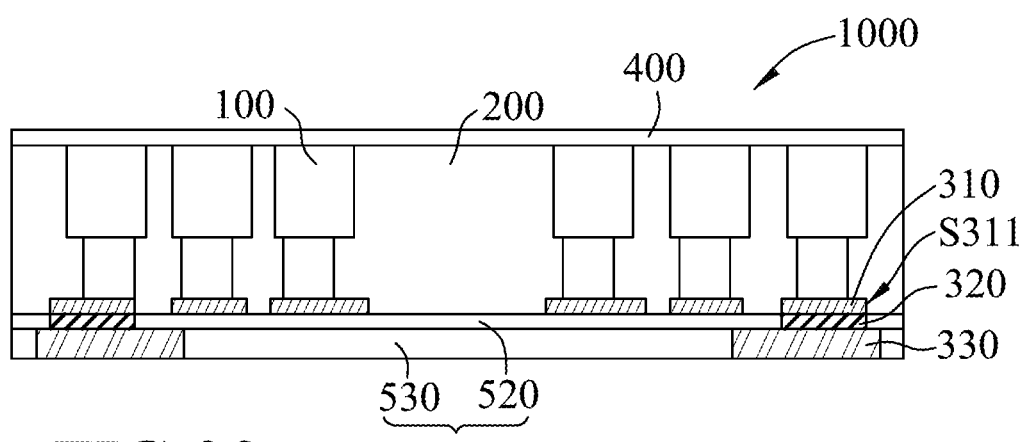
FIG. 23 is a schematic cross-sectional view illustrating a sixth embodiment of the LED packaging module according to the present disclosure.

FIG. 23 illustrates a sixth embodiment of the LED packaging module 1000 of the present disclosure. The sixth embodiment of the LED packaging module 1000 is free of a substrate. The sixth embodiment of the LED packaging module 1000 is similar to the first embodiment, except that the encapsulating layer 200 covers both sidewalls of the LED chips 100 and sidewalls S311 of the wires of the first wiring layer 310. That is, the wires of the first wiring layer 310 is surrounded by the encapsulating layer 200. The encapsulating layer 200 may be made to be opaque or has a low light transmittance. The encapsulating layer 200 may have a light transmittance of lower than about 30%, e.g., from about 5% to about 20%. In certain embodiments, the encapsulating layer 200 is made of a black material, such as epoxy resin or silica gel mixed with black particles. In some embodiments, at least one of the second insulation layer 520 and the third insulation layer 530 may include a light-transmitting material or a light-blocking material.

In the present disclosure, through reasonable arrangement of the LED chips 100 and design of the first and second wiring layers 310, 330 and the via layer 320, wires/vias in the wiring assembly 300 can be simplified, and reliability of the LED packaging module 1000 can be improved. By using no more than three interconnecting layers in the wiring assembly, the LED packaging module 1000 can be thin and light, which is beneficial to miniaturization of an end product including the LED packaging module 1000.

As described above, the LED packaging module 1000 of the present disclosure utilizes the encapsulating layer 200 to fix and encapsulate the light-emitting units (i.e., light-emitting units) arranged in an array, and uses the wiring assembly 300 to connect the LED chips 100 of each of the light-emitting units. Therefore, the LED packaging module 1000 of the present disclosure does not require wire bonding and circuit boards with complicated circuit trace, which improves reliability and contrast of the LED packaging module 1000. In addition, the electrode assembly 110 of each of the LED chips 100 does not need to be soldered to a circuit board using solder paste, which avoids issues related to poor chip soldering, and improves integration between the LED chips 100 and other electronic devices.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode (LED) packaging module, comprising:
   a plurality of LED chips that are spaced-apart from one another, each of said LED chips including:
   a chip first surface as a light-exiting surface;
   a chip second surface opposite to said chip first surface of said each of said LED chips;
   a chip side surface that connects said chip first surface of said each of said LED chips and said chip second surface of said each of said LED chips; and
   an electrode assembly disposed on said chip second surface of said each of said LED chips, said electrode assembly including a first electrode and a second electrode;
   an encapsulating layer that covers said chip side surface of each of said LED chips and fills in a space among said LED chips, and that exposes said first electrode, said second electrode, and at least a portion of said chip first surface of each of said LED chips, said encapsulating layer being a colored layer;
   a light-transmitting layer that is disposed on said encapsulating layer, that covers the portion of said chip first surface of each of said LED chips exposed from said encapsulating layer, and that has a light transmittance greater than that of said encapsulating layer;
   a wiring assembly that is disposed on said chip second surface of each of said LED chips, that has a first wiring assembly surface connected to said electrode assembly of each of said LED chips, a second wiring assembly surface opposite to said first wiring assembly surface, and a side wiring assembly surface that is connected to said first wiring assembly surface and said second wiring assembly surface; and
   an insulation component that covers said encapsulating layer and said wiring assembly,
   wherein said LED chips are formed into a plurality of light-emitting units, each of said light-emitting units including at least three of said LED chips,
   wherein said light-emitting units are arranged in an array having m row(s) and n column(s), m and n each independently representing a positive integer, and
   wherein adjacent two of said light-emitting units are spaced apart from one another by a distance that is not greater than 1 mm.

2. The LED packaging module as claimed in claim 1, wherein said encapsulating layer has a light transmittance that is not greater than 50%.

3. The LED packaging module as claimed in claim 1, wherein said wiring assembly has a thickness ranging from 20 μm to 200 μm.

4. The LED packaging module as claimed in claim 1, wherein said encapsulating layer includes light-absorbing particles.

5. The LED packaging module as claimed in claim 1, wherein said light-transmitting layer has a light transmittance that ranges from 40% to 80%.

6. The LED packaging module as claimed in claim 1, wherein said light-transmitting layer has a light transmittance that is not less than 70%.

7. The LED packaging module as claimed in claim 1, wherein said light-transmitting layer has a thickness that ranges from 5 μm to 20 μm.

8. The LED packaging module as claimed in claim 1, wherein said light-transmitting layer is a light-scattering layer.

9. The LED packaging module as claimed in claim 1, wherein said wiring assembly includes a via layer which has a thickness that ranges from 20 μm to 50 μm.

10. The LED packaging module as claimed in claim 9, wherein said wiring assembly includes a metallic material having a melting point higher than 400° C.

11. The LED packaging module as claimed in claim 1, wherein, in each of said light-emitting units, a maximum height difference among said chip first surfaces of said LED chips is not greater than 10 μm.

12. The LED packaging module as claimed in claim 1, wherein said insulation component is made of a material the same as that of said encapsulating layer.

13. A light-emitting diode (LED) packaging module, comprising:
   a plurality of LED chips that are spaced-apart from one another, each of said LED chips including:
   a chip first surface as a light-exiting surface;
   a chip second surface opposite to said chip first surface of said each of said LED chips;
   a chip side surface that connects said chip first surface of said each of said LED chips and said chip second surface of said each of said LED chips; and
   an electrode assembly disposed on said chip second surface of said each of said LED chips, said electrode assembly including a first electrode and a second electrode;
   an encapsulating layer that covers said chip side surface of each of said LED chips and fills in a space among said LED chips, and that exposes said first electrode, said second electrode, and at least a portion of said chip first surface of each of said LED chips, said encapsulating layer being a colored layer;
   a light-transmitting layer that is disposed on said encapsulating layer, that covers the portion of said chip first surface of each of said LED chips exposed from said encapsulating layer, and that has a light transmittance greater than that of said encapsulating layer;
   a wiring assembly that is disposed on said chip second surface of each of said LED chips, that has a first wiring assembly surface connected to said electrode assembly of each of said LED chips, a second wiring assembly surface opposite to said first wiring assembly surface, and a side wiring assembly surface that is connected to said first wiring assembly surface and said second wiring assembly surface; and
   an insulation component that covers said encapsulating layer and said wiring assembly,
   wherein said insulation component has a plurality of insulation layers, at least one of said insulation layers having a light transmittance that is greater than that of said encapsulating layer.

14. The LED packaging module as claimed in claim 13, wherein at least one of said insulation layers is free of microparticles.

15. The LED packaging module as claimed in claim 13, wherein at least one of said insulation layers is made from a photosensitive material.

16. The LED packaging module as claimed in claim 1, wherein said wiring assembly includes a plurality of interconnecting layers, an amount of said interconnecting layers being not greater than 3.

17. The LED packaging module as claimed in claim 16, wherein at least one of said interconnecting layers has a thickness not greater than 50 μm.

18. The LED packaging module as claimed in claim 1, wherein adjacent two of said LED chips in each of said light-emitting units are spaced apart by a distance that is not greater than 100 μm.

19. The LED packaging module as claimed in claim 1, wherein said LED packaging module has a thickness ranging from 100 μm to 500 μm.

* * * * *